(12) United States Patent
Obata

(10) Patent No.: US 9,712,109 B2
(45) Date of Patent: Jul. 18, 2017

(54) RESONATION DEVICE, OSCILLATOR, ELECTRONIC APPARATUS, AND MOVING OBJECT

(71) Applicant: Seiko Epson Corporation, Tokyo (JP)

(72) Inventor: Naohisa Obata, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/988,158

(22) Filed: Jan. 5, 2016

(65) Prior Publication Data

US 2016/0197595 A1    Jul. 7, 2016

(30) Foreign Application Priority Data

Jan. 6, 2015   (JP) ................................ 2015-000676
Jan. 6, 2015   (JP) ................................ 2015-000680

(51) Int. Cl.
*H03B 5/32*   (2006.01)
*H03H 9/10*   (2006.01)
*H03H 9/13*   (2006.01)
*H03H 9/17*   (2006.01)

(52) U.S. Cl.
CPC ............ *H03B 5/32* (2013.01); *H03H 9/1021* (2013.01); *H03H 9/132* (2013.01); *H03H 9/171* (2013.01)

(58) Field of Classification Search
CPC .................................................. H01L 41/053
USPC ...................................... 331/68; 310/344, 348
See application file for complete search history.

(56) References Cited

U.S. PATENT DOCUMENTS

| 2008/0231145 A1* | 9/2008 | Nagano ................. B22F 1/0074 310/344 |
| 2012/0133248 A1* | 5/2012 | Kusano .............. H03H 9/02023 310/348 |
| 2013/0049543 A1* | 2/2013 | Amano ................ H03H 9/0595 310/344 |

FOREIGN PATENT DOCUMENTS

| JP | 11-274889 A | 10/1999 |
| JP | 2002-246869 A | 8/2002 |
| JP | 2010-087715 A | 4/2010 |
| JP | 2011-041040 A | 2/2011 |
| JP | 2014-033368 A | 2/2014 |
| JP | 2014-086842 A | 5/2014 |

* cited by examiner

*Primary Examiner* — Jeffrey Shin
(74) *Attorney, Agent, or Firm* — Harness, Dickey & Pierce, P.L.C.

(57) ABSTRACT

In a crystal resonator, a resonator element is installed in a package via a first bonding member and a second bonding member, and when viewed from above, a distance between a first bonding center and a second bonding center is set to be L1, and a length of a perpendicular line drawn to a virtual line which connects the first bonding center and the second bonding center from the resonation area center is set to be L2, a relationship expressed by 0<L1/L2≤0.97 is satisfied.

22 Claims, 15 Drawing Sheets

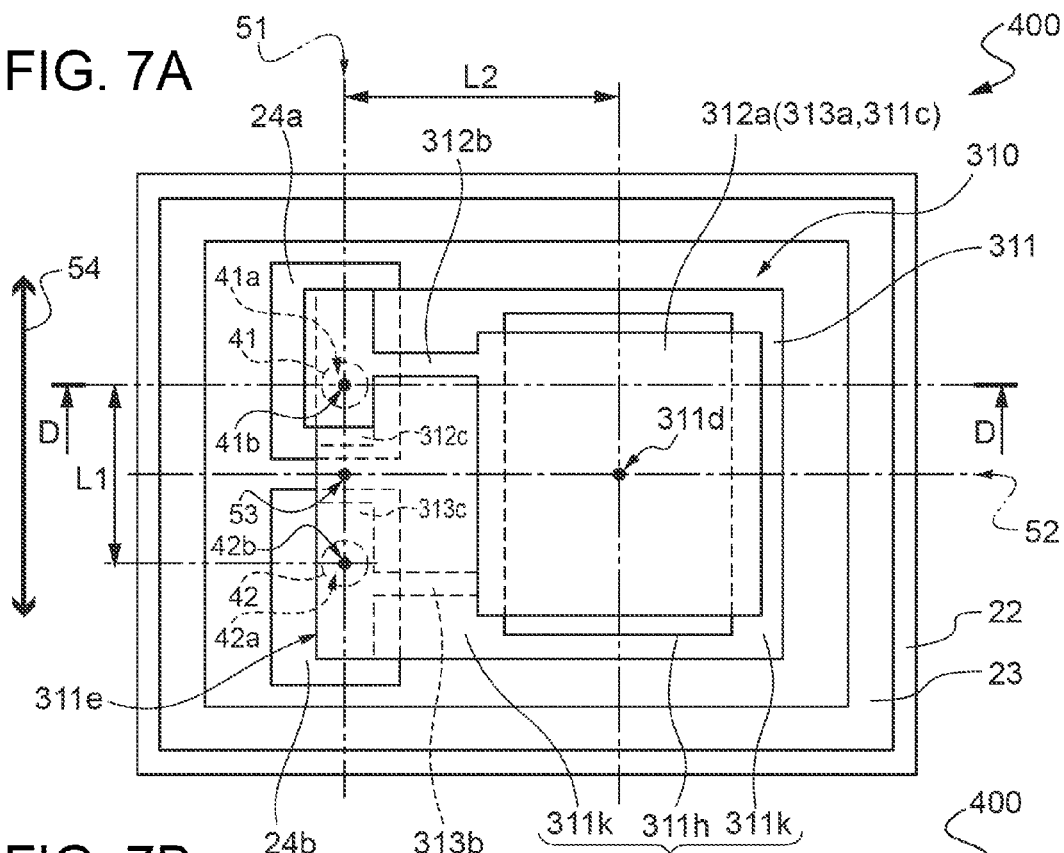
FIG. 7A
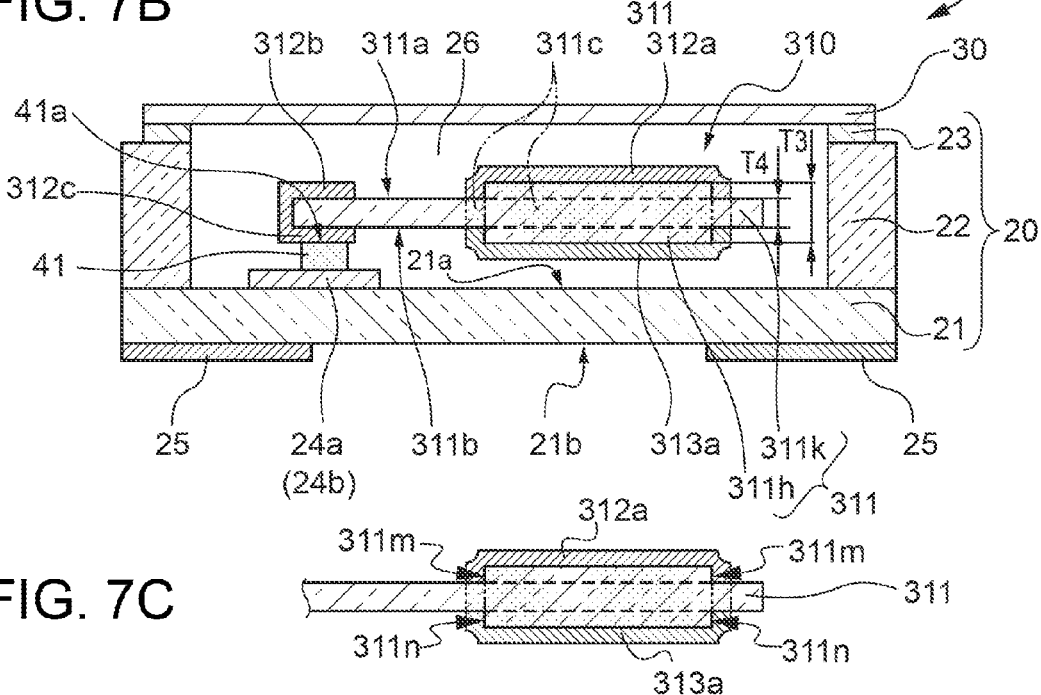
FIG. 7B
FIG. 7C

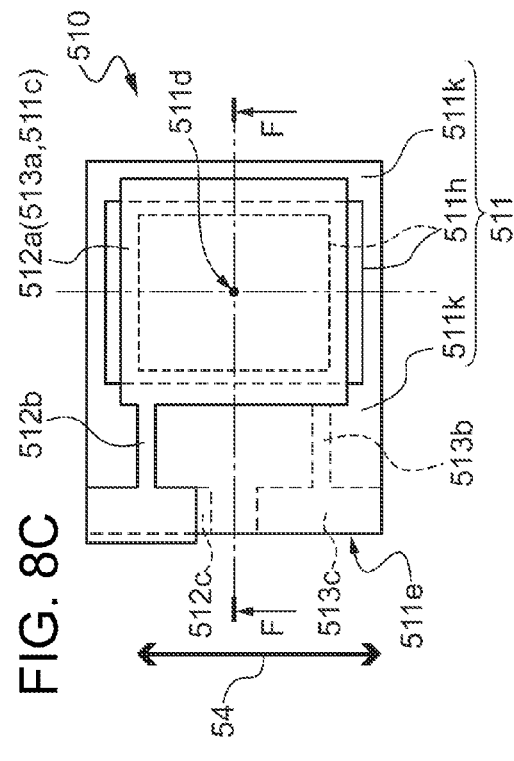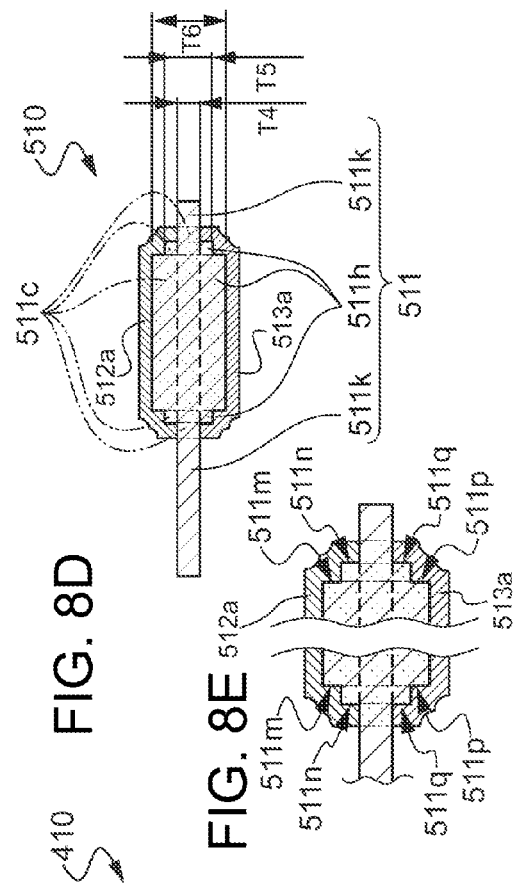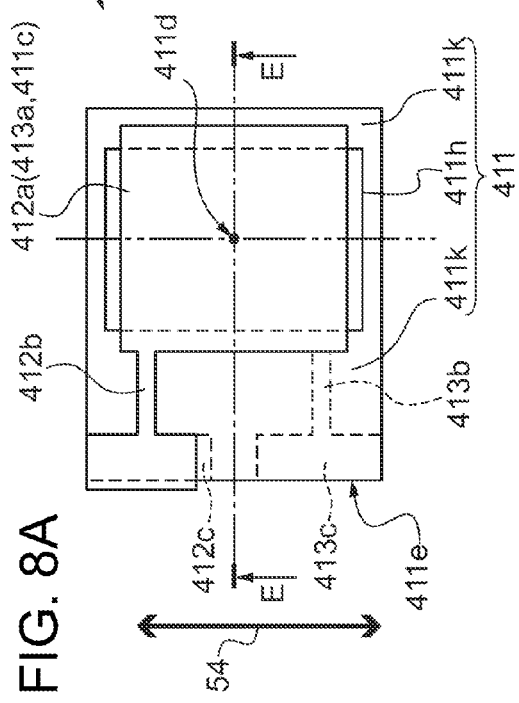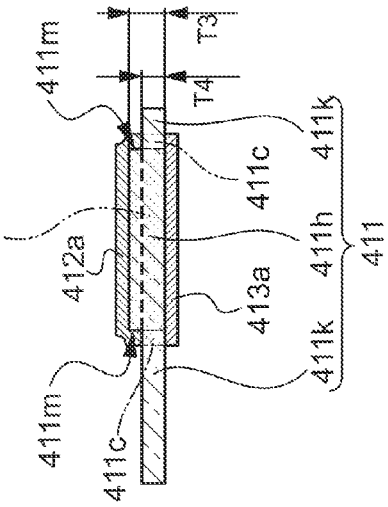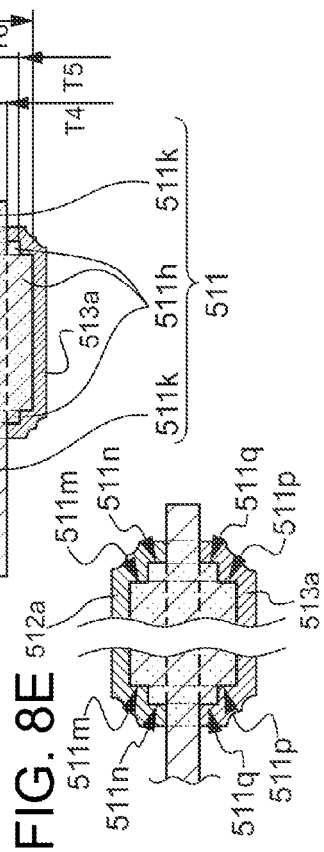

RESONATION DEVICE, OSCILLATOR, ELECTRONIC APPARATUS, AND MOVING OBJECT

BACKGROUND

1. Technical Field

The present invention relates to a resonation device, an oscillator, an electronic apparatus, and a moving object.

2. Related Art

In a communication equipment industry, in order to obtain a stable frequency signal, a resonation device such as a crystal resonator and a crystal oscillator which output a desired frequency signal by using a resonator element which is formed of a piezoelectric substance such as a crystal has been used for a long time. For example, as disclosed in JP-A-2014-86842, the resonation device, which cantilever-supports the resonator element on a connection pad in a container by using an electroconductive adhesive, is configured to stably secure a thickness of the electroconductive adhesive by providing a bank portion on an electrode pad in the container. In such a configuration, the resonation device reduces a temperature gradient in the resonator element by reducing heat from being transferred to the resonator element from the outside of the container via an electroconductive adhesive so as to reduce the variation in frequency characteristics of the resonation device, for example, reproducibility of a frequency change with respect to a temperature change, that is, a hysteresis.

However, in the resonation device disclosed in JP-A-2014-86842, the hysteresis which is the variation in frequency characteristics of the resonation device is also changed due to a stress which is caused by an ambient temperature change of the resonation device and is applied to the resonator element, other than the heat transferred from the outside of the container. The stress which is caused by the ambient temperature change of the resonation device and is applied to the resonator element greatly affects a positional relationship between a distance between connection members which connect the resonator element and the container and an excitation electrode of the resonator element. For this reason, it is likely that the variation in characteristics of the resonation device, for example, the hysteresis is increased by when only securing the stable thickness of the electroconductive adhesive which connects the container and the resonator element as the resonation device disclosed in JP-A-2014-86842.

SUMMARY

An advantage of some aspects of the invention is to solve at least a part of the problems described above, and the invention can be implemented as the following forms or application examples.

Application Example 1

A resonation device according to this application example includes a substrate; a resonator element which includes a resonation area interposed between a pair of excitation electrodes which are disposed on a front surface and a rear surface; and a first bonding member and a second bonding member which bond the resonator element and the substrate, and are disposed side by side in a first direction along the first side of the resonator element, in which the excitation electrode includes a base layer including at least one type of metal of nickel and tungsten on the front and rear surface, and an upper layer including at least one type of metal among gold, platinum, silver, aluminum, and copper on the base layer, the center of a resonator element-side surface of the first bonding member is set to be a first bonding center, the center of a resonator element-side surface of the second bonding member is set to be a second bonding center, and a center which is viewed from one side of the pair of excitation electrodes in the resonation area is set to be a resonation area center, and when a distance between the first bonding center and the second bonding center is set to be L1, and a length of a perpendicular line drawn to a virtual line which connects the first bonding center and the second bonding center from the resonation area center is set to be L2, a relationship expressed by $0<L1/L2\leq0.97$ is satisfied.

According to this application example, in a case where the stress is generated due to a difference between an elongation amount or a shrinkage amount of the resonator element and an elongation amount or a shrinkage amount of the substrate, in accordance with the change of the ambient temperature of the resonation device, it is possible to reduce the stress, which is generated due to the difference between the elongation amount or the shrinkage amount of the resonator element and the elongation amount or the shrinkage amount of the substrate, so as not to be transferred to the resonation area of the resonator element by satisfying a relationship expressed by $0<L1/L2\leq0.97$. The characteristics of the resonator element, for example, an output frequency, a frequency-temperature characteristic, and an equivalent series resistance are greatly varied depending on a state of the resonation area, and thus when the stress transferred to the resonation area is reduced, and thus it is possible to reduce the variation in characteristics of the resonation device, for example, the variation in the frequency-temperature characteristic or the hysteresis.

Application Example 2

In the resonation device according to the application example, it is preferable that a relationship expressed by $0<L1/L2\leq0.85$ is satisfied.

According to this application example, for example, in a case where the stress is generated due to the difference between the elongation amount or the shrinkage amount of the resonator element and the elongation amount or the shrinkage amount of the substrate, in accordance with the change of the ambient temperature of the resonation device, it is possible to further reduce the stress, which is generated due to the difference between the elongation amount or the shrinkage amount of the resonator element and the elongation amount or the shrinkage amount of the substrate, so as not to be transferred to the resonation area of the resonator element by satisfying a relationship expressed by $0<L1/L2\leq0.85$. Accordingly, when the stress transferred to the resonation area of the resonator element is reduced, it is possible to further reduce the variation in characteristics of the resonation device, for example, the hysteresis compared with Application Example 1.

Application Example 3

In the resonation device according to the application example, it is preferable that when a virtual line which passes through the resonation area center and is parallel to the first direction is set to be a third virtual line, a distance between the first bonding center and the perpendicular line is set to be La, a distance between the second bonding center and the perpendicular line is set to be Lb, a distance between the resonation area center and an end portion of the resonation area, which is positioned on the first bonding member side with respect to the perpendicular line and intersects with the third virtual line, is set to be Wa, and a distance between the resonation area center and an end portion of the resonation area, which is positioned on the second bonding member side with respect to the perpendicular line and intersects with the third virtual line, is set to be Wb, in case of La/Wa>Lb/Wb, relationship expressed by 0<La/Wa≤0.89 is satisfied, and in case of La/Wa<Lb/Wb, relationship expressed by 0<Lb/Wb≤0.89 is satisfied.

According to this application example, in a case where the stress is generated due to the difference between the elongation amount or the shrinkage amount of the resonator element and the elongation amount or the shrinkage amount of the substrate, in accordance with the change of the ambient temperature of the resonation device, it is possible to reduce the stress, which is generated due to the difference between the elongation amount or the shrinkage amount of the resonator element and the elongation amount or the shrinkage amount of the substrate, so as not to be transferred to the resonation area of the resonator element by respectively satisfying the relationships expressed by 0<La/Wa≤0.89 and 0<Lb/Wb≤0.89 in the cases of La/Wa>Lb/Wb and La/Wa<Lb/Wb. The characteristics of the resonator element, for example, the output frequency, the frequency-temperature characteristic, and the equivalent series resistance are greatly varied depending on the state of the resonation area, and thus when the stress transferred to the resonation area is reduced, and thus it is possible to reduce the variation in characteristics of the resonation device, for example, the variation in the frequency-temperature characteristic or the hysteresis.

Application Example 4

In the resonation device according to the application example, it is preferable that in case of La/Wa>Lb/Wb, relationship expressed by 0<La/Wa≤0.77 is satisfied, and in case of La/Wa<Lb/Wb, relationship expressed by 0<Lb/Wb≤0.77 is satisfied.

According to this application example, for example, in a case where the stress is generated due to the difference between the elongation amount or the shrinkage amount of the resonator element and the elongation amount or the shrinkage amount of the substrate, in accordance with the change of the ambient temperature of the resonation device, it is possible to further reduce the stress, which is generated due to the difference between the elongation amount or the shrinkage amount of the resonator element and the elongation amount or the shrinkage amount of the substrate, so as not to be transferred to the resonation area of the resonator element by respectively satisfying the relationships expressed by 0<L1/W1≤0.77 and 0<L2/W2≤0.77 in the cases of L1/W1>L2/W2 and L1/W1<L2/W2. Accordingly, when the stress transferred to the resonation area of the resonator element is further reduced, it is possible to reduce the variation in characteristics of the resonation device, for example, the hysteresis by 28% or more than that in Application Example 3.

Application Example 5

In the resonation device according to the application example, it is preferable that in a planar view, the resonator element includes a hollow between the virtual line which connects the first bonding center and the second bonding center, and the excitation electrode in a direction in which at least one surface of the front surface and the rear surface faces the other surface.

According to this application example, the stress, which is generated due to the difference between the elongation amount or the shrinkage amount of the resonator element and the elongation amount or the shrinkage amount of the substrate in accordance with the change of the ambient temperature of the resonation device, is also transferred to the resonation area via a hollow, and a length of a portion in which the hollow is formed is shorter than that of a portion in which the hollow is not formed in the direction intersecting with the front surface and the rear surface, that is, the portion in which the hollow is formed is thin, and thus is easily distorted. Accordingly, the stress, which is generated due to the difference between the elongation amount or the shrinkage amount of the resonator element and the elongation amount or the shrinkage amount of the substrate in accordance with the change of the ambient temperature of the resonation device, is absorbed because the portion in which the hollow is formed is much more distorted than the portion in which the hollow is not formed, and thus when the stress transferred to the resonation area of the resonator element is reduced, it is possible to further reduce the variation in characteristics of the resonation device, for example, the variation in the frequency-temperature characteristic, or the hysteresis.

Application Example 6

In the resonation device according to the application example, it is preferable that the hollow is a hole which penetrates from one surface of the front surface and the rear surface to the other surface.

According to this application example, the stress, which is generated due to the difference between the elongation amount or the shrinkage amount of the resonator element and the elongation amount or the shrinkage amount of the substrate in accordance with the change of the ambient temperature of the resonation device, is transferred to the resonation area via an area in which the hole is not opened and an area adjacent to an area in which the hole is opened of the resonator element, and the area adjacent to the area in which the hole is opened of the resonator element is more easily distorted than the area which is not adjacent to the area in which the hole is opened, that is, the area in which the hole is not opened. Accordingly, the stress, which is generated due to the difference between the elongation amount or the shrinkage amount of the resonator element and the elongation amount or the shrinkage amount of the substrate in accordance with the change of the ambient temperature of the resonation device, is absorbed because the area adjacent to the area in which the hole is opened of the resonator element is much more distorted than the area in which the hole is not opened, and thus when the stress transferred to the resonation area of the resonator element is reduced, it is possible to further reduce the variation in characteristics of the resonation device, for example, the variation in the frequency-temperature characteristic, or the hysteresis.

Application Example 7

In the resonation device according to the application example, it is preferable that the resonator element includes a first area having a first thickness and a second area having a thickness which is smaller than the first thickness in the direction which intersects with the front surface and the rear surface, in which the resonation area center overlaps the first area in a planar view, and the first bonding center and the second bonding center overlaps the second area in planar view.

According to this application example, the stress, which is generated due to the difference between the elongation amount or the shrinkage amount of the resonator element and the elongation amount or the shrinkage amount of the substrate in accordance with the change of the ambient temperature of the resonation device, is transferred to the resonation area via second area, and the second area is thinner than the first area and thus is more easily distorted. Accordingly, the stress, which is generated due to the difference between the elongation amount or the shrinkage amount of the resonator element and the elongation amount or the shrinkage amount of the substrate in accordance with the change of the ambient temperature of the resonation device, is absorbed because the second area is much more distorted than the first area, and thus when the stress transferred to the resonation area of the resonator element is further reduced, it is possible to further reduce the variation in characteristics of the resonation device, for example, the variation in the frequency-temperature characteristic, or the hysteresis.

Application Example 8

In the resonation device according to the application example, it is preferable that the first bonding member and the second bonding member have conductivity.

According to this application example, the first bonding member and the second bonding member have the conductivity, and thus a mechanical bonding and an electrical bonding can be concurrently performed between the resonator element and the substrate. Accordingly, it is possible to reduce the number of members used for the resonation device compared with a case where the mechanical bonding and the electrical bonding which are performed between the resonator element and the substrate by using different members, and thus it is possible to efficiently manufacture the resonation device in which the variation in the frequency-temperature characteristic, the hysteresis, or the like is reduced.

Application Example 9

In the resonation device according to the application example, it is preferable that at least one of the first bonding member and the second bonding member is formed of a metallic bump.

According to this application example, at least one of the first bonding member and the second bonding member is formed of the metallic bump, for example, metal which is formed through a plating method and a bonding method. The metallic bump has less gas emission from the inside of the metallic bump due to the heat and the time elapse compared with a resin member such as an adhesive. Accordingly, it is possible to reduce the variation in characteristics of the resonation device, for example, the variation in the frequency-temperature characteristic or the hysteresis, and to reduce the variation of the characteristics of the resonation device, for example, the output frequency, the frequency-temperature characteristic, and the equivalent series resistance due to the heat and the time elapse of the resonation device.

Application Example 10, Application Example 11, Application Example 12, and Application Example 13

An oscillator according to each of these application examples includes the resonation device according to any one of the above-described application examples, which is bonded to the substrate and has a lid which forms an inner space for accommodating the resonator element; an oscillation circuit which is connected to one surface of the resonation device via a bonding member; and a container which accommodates the resonation device and the oscillation circuit.

According to these application examples, it is possible to realize the oscillator having high reliability in which the variation in characteristics is reduced, for example, the variation in the frequency-temperature characteristic or the hysteresis is reduced by using the resonation device which reduces the variation in characteristics by reducing the stress which is generated due to a difference between an elongation amount or a shrinkage amount of the resonator element and an elongation amount or a shrinkage amount of the substrate in accordance with the change of the ambient temperature of the resonation device, so as not to be transferred to the resonator element.

Application Example 14, Application Example 15, Application Example 16, and Application Example 17

In the oscillator according to the application examples, the lid and the oscillation circuit may be connected to each other via bonding member in the oscillator according to any one of the above-described application examples.

According to these application examples, it is possible to realize the oscillator having high reliability in which the variation in characteristics, for example, the variation in the frequency-temperature characteristic or the hysteresis is reduced by using the resonation device which reduces the variation in characteristics by reducing the stress which is generated due to a difference between an elongation amount or a shrinkage amount of the resonator element and an elongation amount or a shrinkage amount of the substrate in accordance with the change of the ambient temperature of the resonation device, so as not to be transferred to the resonator element.

Application Example 18

An electronic apparatus according to this application example includes the resonation device according to any one of the above-described application examples.

According to this application example, it is possible to realize the electronic apparatus having high reliability in which the variation in characteristics, for example, the variation in the frequency-temperature characteristic or the hysteresis is reduced by using the resonation device which reduces the variation in characteristics by reducing the stress which is generated due to a difference between an elongation amount or a shrinkage amount of the resonator element and an elongation amount or a shrinkage amount of the substrate in accordance with the change of the ambient temperature of the resonation device, so as not to be transferred to the resonator element.

Application Example 19

A moving object according to this application example includes the resonation device according to any one of the above-described application examples.

According to this application example, it is possible to realize the moving object having high reliability in which the variation in characteristics, for example, the variation in the frequency-temperature characteristic or the hysteresis is reduced by using the resonation device which reduces the variation in characteristics by reducing the stress which is generated due to a difference between an elongation amount or a shrinkage amount of the resonator element and an elongation amount or a shrinkage amount of the substrate in accordance with the change of the ambient temperature of the resonation device, so as not to be transferred to the resonator element.

BRIEF DESCRIPTION OF THE DRAWINGS

The invention will be described with reference to the accompanying drawings, wherein like numbers reference like elements.

FIG. 1A is a plan view and FIG. 1B is a sectional view taken along line A-A of FIG. 1A.

FIG. 2A is a sectional view taken along a first virtual line when a relationship expressed by L1=W1 is satisfied in FIG. 1A, and FIG. 2B is a sectional view taken along the first virtual line when a relationship expressed by L1=W2 is satisfied in FIG. 1A.

FIG. 3A is a sectional view taken along a second virtual line in FIG. 1A, and FIG. 3B is a schematic view of a stress distribution when relationships expressed by L1=W1 and L1=W2 are satisfied.

FIG. 5A is a plan view and FIG. 5B is a sectional view taken along line B-B of FIG. 5A.

FIG. 6A is a plan view and FIG. 6B is a sectional view taken along line C-C of FIG. 6A.

FIGS. 7A and 7C are schematic configuration diagrams of a crystal resonator 400 as a resonation device according to a fourth embodiment, and FIG. 7A is a plan view, FIG. 7B is a sectional view taken along line D-D of FIG. 7A, and FIG. 7C is a sectional view of a part of an excitation electrode portion.

FIGS. 8A and 8E are schematic configuration diagrams illustrating Modification Example of the resonator element of the crystal resonator 400 as the resonation device according to the fourth embodiment, and FIG. 8A is a plan view of the resonator element 410 which is an example of Modification Example, FIG. 8B is a sectional view taken along line E-E in FIG. 8A, FIG. 8C is a plan view of the resonator element 510 which is another example of Modification Example, FIG. 8D is a sectional view taken along line F-F in FIG. 8C, and FIG. 8E is a partially enlarged sectional view of an excitation electrode portion in FIG. 8D.

FIG. 9A is a plan view and FIG. 9B is a sectional view taken along line G-G of FIG. 9A.

FIG. 10A is a plan view and FIG. 10B is a sectional view taken along line H-H of FIG. 10A.

FIG. 12A is a plan view and FIG. 12B is a sectional view taken along line J-J of FIG. 12A.

DESCRIPTION OF EXEMPLARY EMBODIMENTS

Hereinafter, the embodiment of the invention will be described with reference to the drawings. Further, in the following drawings, in order to make the magnitude of the respective layers and members recognizable, there is a case of making the scale of the respective layers and members different from that in the actual structure.

First Embodiment

A crystal resonator 100 as an example of a resonation device according to the embodiment will be described. The crystal resonator 100 is a resonation device which oscillates at a predetermined frequency by a predetermined AC voltage applied from the outside.

Crystal Resonator

Figure 1A:
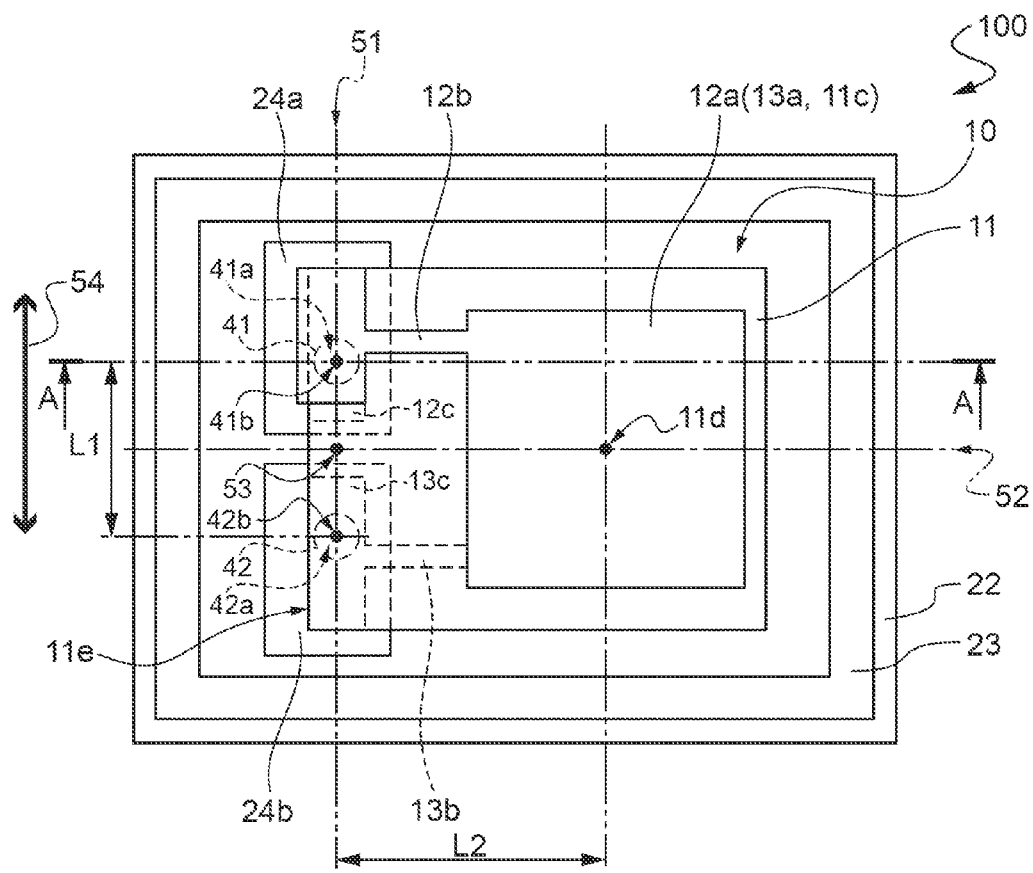
FIGS. 1A and 1B are schematic configuration diagrams of a crystal resonator 100 as a resonation device according to a first embodiment.
Figure 1B:
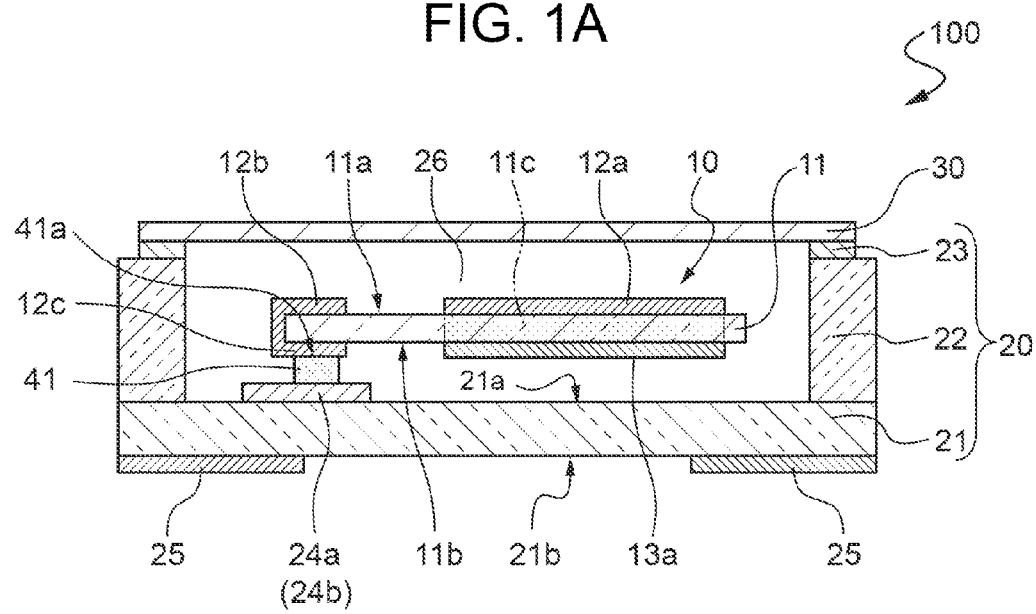

First, a schematic configuration of the crystal resonator 100 as the resonation device according to the first embodiment will be described. FIGS. 1A and 1B are schematic configuration diagrams of the crystal resonator 100 as the resonation device of the first embodiment, and FIG. 1A is a plan view and FIG. 1B is a sectional view taken along line A-A of FIG. 1A.

The crystal resonator 100 is provided with a resonator element 10, a package 20, a first bonding member 41, a second bonding member 42, a lid (a lid body) 30, and the like. Note that, for the sake of convenience of description, the lid 30 is not shown in FIG. 1A. In addition, in the following description, an upper side in FIG. 1B is referred to as "up" and a lower side is referred to as "down", and a surface on the upper side of each member in FIG. 1B is referred to as an upper surface, and a surface on the lower side is referred to as a lower surface.

Resonator Element

The resonator element 10 is provided with a crystal substrate 11 formed of a crystal which is a type of piezoelectric single crystal, excitation electrodes 12a and 13a, extracting electrodes 12b and 13b, and connection electrodes 12c and 13c. The resonator element 10 resonates at a predetermined resonance frequency by applying a predetermined AC voltage to the excitation electrodes 12a and 13a.

The crystal substrate 11 includes an upper surface 11a and a lower surface 11b which are respectively the front surface and the rear surface, and a first side 11e. The excitation electrode 12a and the extracting electrode 12b are formed on the upper surface 11a of the crystal substrate 11. The excitation electrode 13a, the extracting electrode 13b, and the connection electrodes 12c and 13c are formed on the lower surface 11b of the crystal substrate 11. In addition, the connection electrodes 12c and 13c are arranged close to the first side 11e of the lower surface 11b of the crystal substrate 11 in the first direction 54. The extracting electrode 12b extends from the excitation electrode 12a to the connection electrode 12c via side surface which connects the upper surface 11a and the lower surface 11b, and electrically connects the excitation electrode 12a and the connection electrode 12c. The extracting electrode 13b extends from the excitation electrode 13a to the connection electrode 13c, and electrically connects the excitation electrode 13a and the connection electrode 13c.

The excitation electrodes 12a and 13a are formed into a rectangular shape in a planar view, that is, when viewed from above, and are disposed so as to substantially overlap with each other in such a manner that the center of the excitation electrode 12a and the center of the excitation electrode 13a substantially overlap with each other. In addition, the crystal substrate 11 includes a resonation area 11c which is interposed between the excitation electrodes 12a and 13a. Here, the center of each of the excitation electrodes 12a and 13a is the centroid (the center of a drawing) of the shape when the respective excitation electrodes 12a and 13a are viewed from above.

In the embodiment, the excitation electrodes 12a and 13a are disposed in such a manner that the center of the excitation electrode 12a and the center of the excitation electrode 13a substantially overlap with each other; however, it is not limited thereto as long as the excitation electrode 12a and the excitation electrode 13a overlap with each other when viewed from above and have the resonation area 11c. In addition, the excitation electrodes 12a and 13a may be formed into a polygonal shape such as a circular shape, an elliptical shape, and a triangular shape, or may be formed into a polygonal shape having a rounded corner, in addition to the rectangular shape.

The excitation electrodes 12a and 13a, the extracting electrodes 12b and 13b, and the connection electrodes 12c and 13c are formed through a method such as a vapor deposition method, a sputtering method, and a plating method, or through a method of volatilizing a solvent component other than metal after performing the coating with a paste (a solvent) including a metallic member. In addition, the excitation electrodes 12a and 13a, the extracting electrodes 12b and 13b, and the connection electrodes 12c and 13c are configured to have at least two layers of a base layer and an upper layer. Examples of a configuration material for the base layer include an adhesion material with respect to the crystal substrate 11, and specifically, a metallic element such as chromium (Cr), nickel (Ni), titanium (Ti), and tungsten (W), a mixture including one or two or more the metallic elements, or an alloy can be used. On the other hand, examples of a material for the upper layer include a configuration material having particularly high electrical conduction properties, and specifically, a metallic element such as gold (Au), platinum (Pt), silver (Ag), aluminum (Al), and copper (Cu), a mixture including one or two or more the metallic elements, or an alloy can be used. Note that, the excitation electrodes 12a and 13a, the extracting electrodes 12b and 13b, and the connection electrodes 12c and 13c may be configured to have one layer, for example, may be configured to have a metallic element such as gold (Au), platinum (Pt), silver (Ag), aluminum (Al), and copper (Cu), a mixture including one or two or more the metallic elements, or an alloy.

The resonation area 11c includes a resonation area center 11d. In the embodiment, the excitation electrodes 12a and 13a are formed into a rectangular shape and are disposed so as to substantially overlap with each other when viewed from above, and thus the resonation area 11c is formed into a rectangular shape and the resonation area center 11d and the center of each of the excitation electrodes 12a and 13a substantially overlap with each other when viewed from above. Here, the resonation area center 11d is the centroid (the center of a drawing) of the shape when the resonation area 11c is viewed from above.

Package

The package 20 is provided with a bottom plate 21 as a substrate, a side wall 22, a seal ring 23, and the like, and the bottom plate 21 includes an upper surface 21a and a lower surface 21b.

Specifically, in the package 20, an inner space 26 (an accommodating space) of which the center portion is depressed by stacking the side wall 22 on a peripheral portion of the upper surface 21a on the bottom plate 21, and the resonator element 10 is accommodated in the inner space 26. The outer shape of the package 20 is not limited, for example, it may be a rectangular parallelepiped shape, a cylindrical shape, or the like.

The bottom plate 21 and the side wall 22 are preferably formed of a material having the same or approximate coefficient of thermal expansion as that of the resonator element 10 and the lid 30, and ceramics are used in the embodiment.

The seal ring 23 serves as a bonding material which bonds the side wall 22 and the lid 30, is formed of, for example, a metallic brazing material such as a gold brazing material and a silver brazing material, or metal such as glass or kovar, and is provided in a frame shape along the upper surface of the side wall 22.

In addition, the internal connection terminals 24a and 24b are formed on the upper surface 21a of the bottom plate 21, and a plurality of external connection terminals 25 which are electrically connected to at least an outer circuit and a mount substrate of the crystal resonator 100 are formed on the lower surface 21b of the bottom plate 21.

The internal connection terminals 24a and 24b and the plurality of external connection terminals 25 are obtained through sequential steps of, for example, tungsten metalizing, nickel-plating, and gold-plating.

The internal connection terminals 24a and 24b are electrically connected to two external connection terminals 25 which are different from each other in the plurality of external connection terminals 25 via a wiring (not shown) which is disposed on the bottom plate 21. In addition, the plurality of external connection terminals 25 are electrodes which are used to supply an AC voltage to the resonator element 10 and output an electrical signal such as a frequency by being electrically connected to at least the external mount substrate (not shown).

Lid

The lid 30 is formed into a flat plate-like shape which covers an opening of the package 20, and formed of metal such as kovar and 42 alloy, ceramics, glass and the like.

The lid 30 is bonded to the seal ring 23 such that the inner space 26 is in an air-tight state, after the resonator element 10 is accommodated in the inner space 26 of the package 20. An inner pressure of the inner space 26 which is in the air-tight state is set to be a predetermined pressure. For example, when the inner space 26 is in a vacuum state (a state where a pressure is lower than an atmospheric pressure ($1\times10^5$ Pa to $1\times10^{-10}$ Pa (JIS Z 8126-1: 1999))) or in the same pressure state as the atmospheric pressure by being filled with an inert gas such as nitrogen or argon. Therefore, the resonator element 10 can continuously and stably resonate.

In addition, the inner space 26 in the embodiment is tightly sealed in a vacuum state. When the inner space 26 is tightly sealed in the vacuum state, a Q value of the accommodated resonator element 10 is increased, and thus the resonator element 10 can continuously and stably resonate.

Bonding Member

The first bonding member 41 and the second bonding member 42 are arranged in the direction in which the first side 11e of the lower surface 11b on the crystal substrate 11 extends.

The first bonding member 41 and the second bonding member 42 are formed of a resin containing a conductive member, for example, an electroconductive adhesive. Examples of the conductive member include a metallic element such as gold (Au), silver (Ag), copper (Cu), aluminum (Al), and platinum (Pt), a mixture such as a metallic fine particle including one or two or more the metallic elements, a resin fine particle obtained by plating the aforementioned metallic elements, and a carbon fine particle. Examples of the resin include an epoxy-based resin, a silicon-based resin, a polyimide-based resin, a polyamide-based resin, or an acrylic resin.

The first bonding member 41 is electrically and mechanically connected to the connection electrode 12c, and is electrically and mechanically connected to an internal connection terminal 24a. The second bonding member 42 is electrically and mechanically connected to the connection electrode 13c, and is electrically and mechanically connected to an internal connection terminal 24b. In other words, the resonator element 10 is supported by the bottom plate 21 via the first bonding member 41 and the internal connection terminal 24a, and the second bonding member 42 and the internal connection terminal 24b. That is, when viewed from above, the resonator element 10 does not come in contact with the bottom plate 21, the side wall 22, the seal ring 23, and the lid 30 but is cantilever-supported by the bottom plate 21 in an area close to a side that the first side 11e faces with the excitation electrodes 12a and 13a interposed therebetween.

Since the first bonding member 41 and the second bonding member 42 have conductivity, a mechanical bonding and an electrical bonding can be concurrently performed between the connection electrode 12c and the internal connection terminal 24a, and between the connection electrode 13c and the internal connection terminal 24b. Accordingly, it is possible to reduce the number of members used for the resonation device compared with a case where the mechanical bonding and the electrical bonding which are performed between the resonator element 10 and the bottom plate 21 by using different members, and thus it is possible to efficiently manufacture the crystal resonator 100.

A first bonding center 41b is positioned on the connection electrode 12c side of the first bonding member 41, that is, an upper surface 41a on the resonator element 10 side. A second bonding center 42b is positioned on the connection electrode 13c side of the second bonding member 42, that is, an upper surface 42a on the resonator element 10 side.

Each of the first bonding center 41b and the second bonding center 42b has a shape when the first bonding member 41 and the second bonding member 42 are viewed from above, that is, the centroid (the center of a drawing) of the shape when the upper surface 41a and the upper surface 42a are viewed from above.

Next, a relationship between the resonation area 11c, the first bonding member 41, and the second bonding member 42 will be described.

First, a virtual line which passes through the first bonding center 41b and the second bonding center 42b is set to be a first virtual line 51, a virtual line which passes through the resonation area center 11d and perpendicular to a first virtual line 51 is set to be a second virtual line 52. In addition, an intersection 53 of the first virtual line 51 and the second virtual line 52 is disposed between the first bonding center 41b and the second bonding center 42b. That is, the first bonding member 41 and the second bonding member 42 are arranged in the first direction 54 which is the direction in which the first side 11e extends while interposing the second virtual line 52 therebetween when viewed from above.

Here, when a distance between the first bonding center 41b and the second bonding center 42b is set to be L1, and a length of perpendicular line drawn to a virtual line which connects the first bonding center 41b and a second bonding center 42b from the resonation area center 11d is set to be L2, that is, a distance between the resonation area center 11d and the intersection 53 is set to be L2, a relationship between the aforementioned L1 and L2 and a hysteresis will be described below.

First, the hysteresis of the crystal resonator 100 will be described. Regarding a resonance frequency of the resonator element 10, a resonance frequency at a predetermined temperature T in a process in which an ambient temperature of the crystal resonator 100 is increased, and a resonance frequency at a predetermined temperature T in a process in which an ambient temperature of the crystal resonator 100 is decreased have different characteristics from each other. Having different characteristics depending on the time the ambient temperature is increased or decreased means to have the hysteresis. The reason for this is as follows.

Since the crystal resonator 100 according to the embodiment is formed of a different material from that of the resonator element 10 and the bottom plate 21, it has a different coefficient of thermal expansion, and thus an elongation amount or a shrinkage amount of the resonator element 10, and an elongation amount or a shrinkage amount the bottom plate 21 in accordance with a change of the ambient temperature of the crystal resonator 100 are different from each other. Accordingly, when the ambient temperature of the crystal resonator 100 is changed, a stress is generated in the resonator element 10 due to a difference between the elongation amount or the shrinkage amount of the resonator element 10 and the elongation amount or the shrinkage amount of the bottom plate 21.

In addition, when the resonator element 10 is bonded to the inside of the crystal resonator 100, that is, the inside of the package 20 via the first bonding member 41 and the second bonding member 42, the change of the ambient temperature of the crystal resonator 100 is slowly transferred to the resonator element 10 compared with the bottom plate 21. That is, in the process in which the ambient temperature of the crystal resonator 100 is increased, the temperature of the resonator element 10 is lower than a predetermined temperature T even when the ambient temperature of the crystal resonator 100 becomes a predetermined temperature T, and in the process in which the ambient temperature of the crystal resonator 100 is decreased, the temperature of the resonator element 10 is higher than a predetermined temperature T even when the ambient temperature of the crystal resonator 100 becomes a predetermined temperature T.

From the above description, even when the ambient temperature of the crystal resonator 100 is a predetermined temperature T, the temperature of the resonator element 10 is differentiated depending on the process in which the ambient temperature is increased or the process in which the ambient temperature is decreased, and thus the elongation amount or the shrinkage amount of the resonator element 10 is differentiated. Accordingly, the stress is generated in the resonator element 10 due to the difference between the elongation amount or the shrinkage amount of the resonator element 10 and the elongation amount or the shrinkage amount of the bottom plate 21, and the stress generated in a case where the ambient temperature becomes a predetermined temperature T in the process in which the ambient temperature of the crystal resonator 100 is increased is different from the stress generated in a case where the ambient temperature becomes a predetermined temperature T in the process in which the ambient temperature is decreased.

Further, it is known that the resonance frequency of the resonator element 10 when a predetermined AC voltage is applied to the resonator element 10 is changed due to a stress applied to the resonator element 10.

Accordingly, regarding the resonance frequency of the crystal resonator 100 including the resonator element 10, the resonance frequency at the temperature T in the process in which the ambient temperature of the crystal resonator 100 is increased is different from the resonance frequency at the temperature T in the process in which the ambient temperature of the crystal resonator 100 is decreased, and this phenomenon is called a characteristic of the hysteresis or the hysteresis.

The reason why the resonance frequency of the resonator element 10 is changed when the stress is applied to the resonator element 10 is that the stress is also applied to the resonation area 11*c* in which a large amount of resonation energy is concentrated in a state where the resonator element 10 resonates, and then the distribution of the resonation energy in the resonation area 11*c* is changed. In addition, in a case where the stress is applied to the entire resonation area 11*c*, that is, as a range of the area to which the stress is applied is spread in the resonation area 11*c*, the distribution of the resonation energy in the resonation area 11*c* is affected compared with a case where the stress is applied to a portion in the resonation area 11*c*, and therefore, it is considered that an amount of change in the resonance frequency of the resonator element 10 becomes larger. From above description, it is considered that when reducing the stress, which is generated by the difference between the elongation amount or the shrinkage amount of the resonator element 10 and the elongation amount or the shrinkage amount of the bottom plate 21 in accordance with the change of the ambient temperature of the crystal resonator 100, so as not to be transferred to the resonation area 11*c*, it is possible to reduce the change of the resonance frequency of the resonator element 10.

In this regard, the inventors of the present application have studied regarding a relationship between the resonation area 11*c*, the first bonding member 41 and the second bonding member 42, and the stress distribution in the resonator element 10.

Figure 2A:
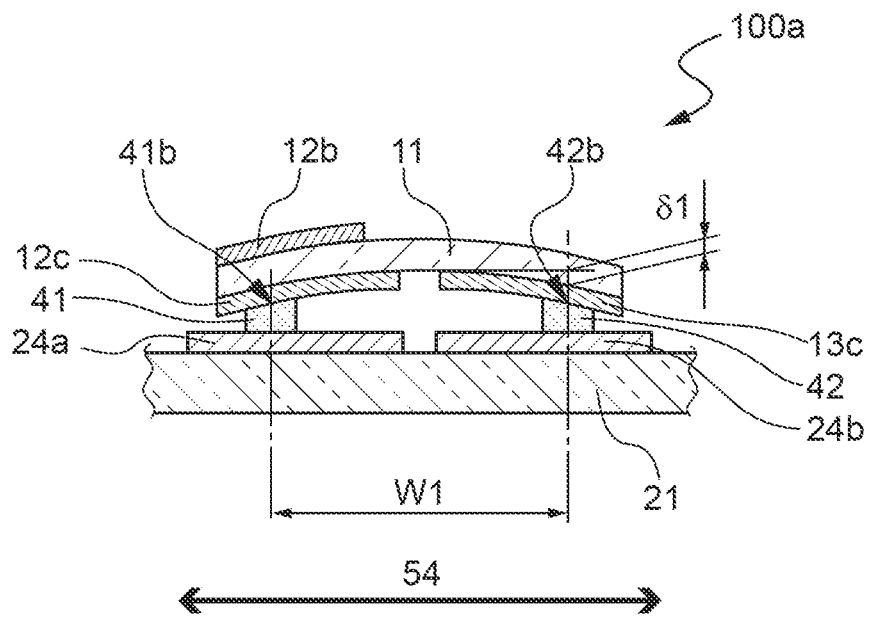
FIGS. 2A and 2B are diagrams illustrating deflection of the resonator element according to the first embodiment.
Figure 2B:
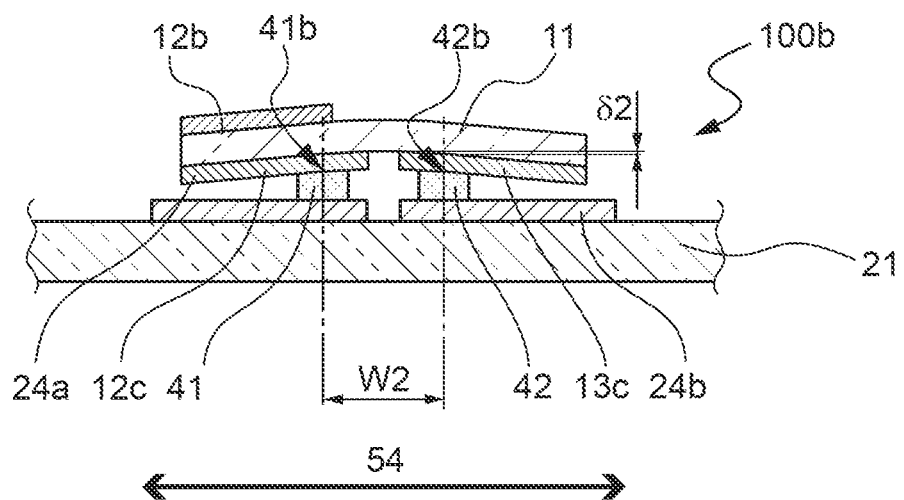

FIGS. 2A and 2B and FIGS. 3A and 3B are diagrams illustrating the stress applied to the resonator element 10 when the ambient temperature becomes a predetermined temperature T in the process in which the ambient temperature of the crystal resonator is increased or decreased. FIG. 2A is a diagram illustrating a deflection of the resonator element 10 when viewed from a sectional direction along the first virtual line 51 in a case where the ambient temperature becomes a predetermined temperature T in the process in which the ambient temperature of the crystal resonator 100*a* is decreased in a crystal resonator 100*a* which satisfies a relationship expressed by L1=W1 in FIGS. 1A and 1B, and FIG. 2B is a diagram illustrating a deflection of the resonator element 10 when viewed from a sectional direction along the first virtual line in a case where the ambient temperature becomes a predetermined temperature T in the process in which the ambient temperature of the crystal resonator 100*b* is decreased in the crystal resonator 100*b* which satisfies a relationship expressed by L1=W2 in FIGS. 1A and 1B. Note that, W1 and W2 satisfy a relationship expressed by W1>W2. In addition, the crystal resonator 100*a* and the crystal resonator 100*b* have the same distance L2 between the intersection 53 and the resonation area center 11*d*.

Figure 3A:
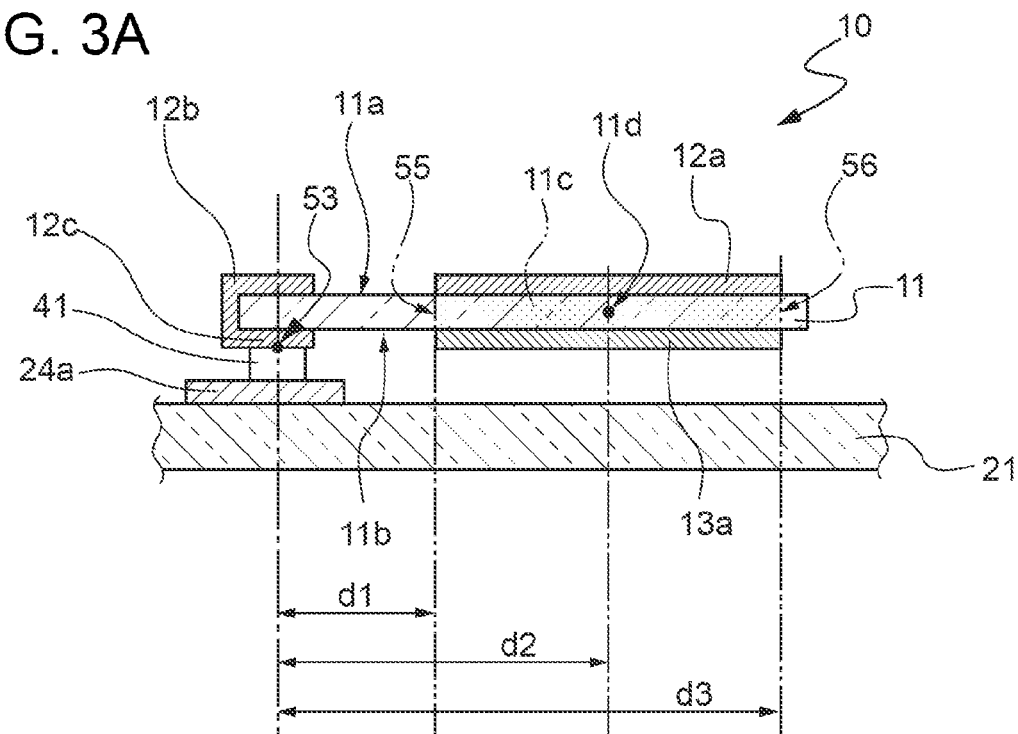
FIGS. 3A and 3B are diagrams illustrating a stress applied to the resonator element according to the first embodiment.
Figure 3B:
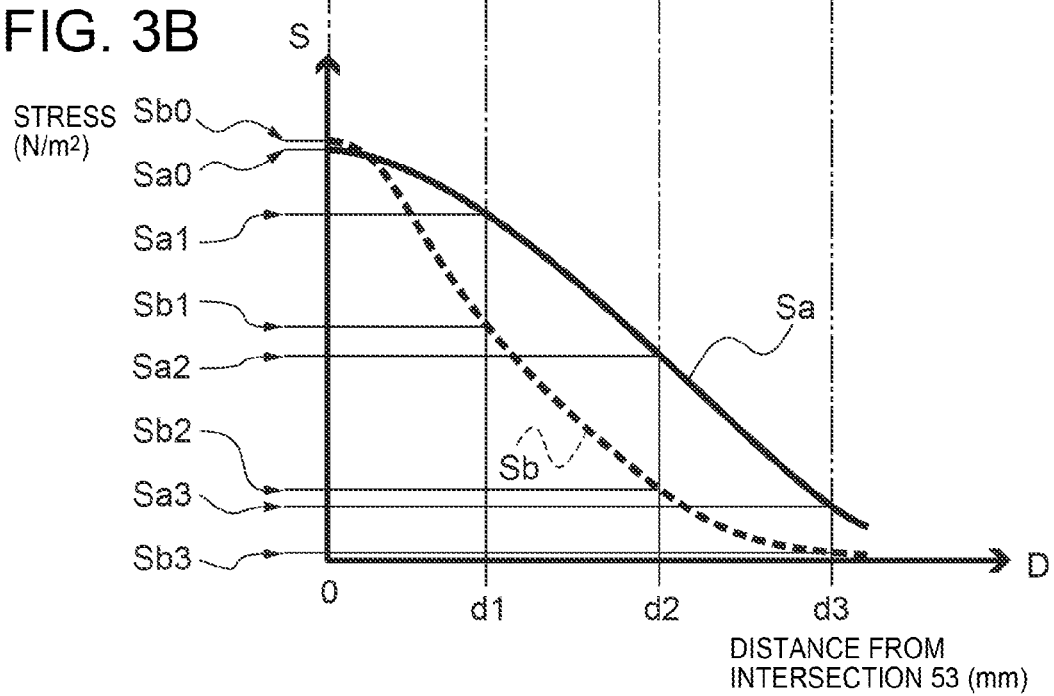

FIG. 3A is a sectional view along the second virtual line 52 in FIG. 1A. FIG. 3B is a schematic view illustrating the stress distribution in the resonator element 10 in the direction in which the second virtual line 52 extends when the ambient temperature becomes a predetermined temperature T, in the crystal resonator 100*a* in FIG. 2A and the crystal resonator 100*b* in FIG. 2B, and Sa represents the stress distribution in the resonator element 10 in the crystal resonator 100*a* and Sb represents the stress distribution in the resonator element 10 in the crystal resonator 100*b*. In addition, in FIG. 3B, a vertical axis represents an absolute value of the stress S $[N/m^2]$, and a horizontal axis represents a distance D [mm] from the intersection 53. In addition, in FIGS. 3A and 3B, a distance between the intersection 53 and an end portion 55, which is close to the first virtual line 51 side with respect to the resonation area center 11*d*, in the resonation area 11*c* is set to be d1, a distance between the first virtual line 51 and the resonation area center 11*d* is set to be d2, and a distance between the intersection 53 and an end portion 56, which is close to the side opposite to the first virtual line 51 with respect to the resonation area center 11*d*, in the resonation area 11*c* is set to be d3.

Note that, for the sake of convenience of description, the side wall 22, the seal ring 23, and the external connection terminal 25 are not illustrated in FIGS. 2A and 2B, and FIG. 3A. In addition, in each of the crystal resonators 100*a* and 100*b*, the excitation electrodes 12*a* and 13*a* are disposed in the same way in the resonator element 10.

As described in the above-mentioned hysteresis, the ambient temperatures of the crystal resonators 100*a* and 100*b* are changed, a difference in the temperature between the resonator element 10 and the bottom plate 21 occurs due to a difference in heat transmission. For example, when the ambient temperature becomes a predetermined temperature T in the process in which the ambient temperatures of the crystal resonators 100*a* and 100*b* are decreased, even when the temperature of the bottom plate 21 becomes a predetermined temperature T, the temperature of the resonator element 10 is higher than a predetermined temperature T. For this reason, for example, in a case where the resonator element 10 and the bottom plate 21 have the same value of positive coefficient of thermal expansion, the temperature of the resonator element 10 is higher than the temperature of the bottom plate 21 in a predetermined temperature T, and thus the elongation amount of the resonator element 10 is larger than elongation amount of the bottom plate 21. Therefore, the resonator element 10 is deflected in the thickness direction.

FIGS. 2A and 2B illustrate the deflection of the resonator element 10 when the ambient temperature becomes a predetermined temperature T in the process in which the ambient temperatures of the crystal resonators 100a and 100b are decreased. From FIGS. 2A and 2B, it is found that regarding the deflection occurred in the resonator element 10, deflection δ2 occurred in the crystal resonator 100b which satisfies the relationship expressed by L1=W2 in FIG. 2B is smaller than deflection δ1 occurred in the crystal resonator 100a which satisfies the relationship expressed by L1=W1 in FIG. 2A. The reason for this is that regarding the distance L1 between the first bonding center 41b and the second bonding center 42b, which is an interval of the bonding member supporting the resonator element 10, the distance W2 in the crystal resonator 100b is shorter than the distance W1 in the crystal resonator 100a, and thus the absolute value of the difference between the elongation amount or the shrinkage amount of the resonator element 10 and the elongation amount or the shrinkage amount of the bottom plate 21 is reduced.

FIG. 3B is a schematic view illustrating the distribution of the stress generated in the resonator element 10 due to the deflection illustrated in FIGS. 2A and 2B, in the direction in which the second virtual line 52 extends in a sectional portion of FIG. 3A. From FIG. 3B, it is found that regarding the distribution of the stress generated in the resonator element 10, Sa and Sb become the maximum values when satisfying a relationship expressed by D=0, and the respective values thereof are Sa0 and Sb0. In addition, the stress applied to each of Sa and Sb is reduced as the distance D from the intersection 53 becomes longer.

Further, regarding the distribution of the stress in the resonator element 10, Sb is rapidly reduced compared with Sa as the distance D from the intersection 53 becomes longer. Further, in FIG. 3B, Sb is reduced compared with Sa in the entire range of D=d1, D=d2, and D=d3. That is, the distribution of the stress generated in the resonation area 11c of the crystal resonator 100b which satisfies the relationship expressed by L1=W2 becomes smaller than the distribution of the stress generated in the resonation area 11c of the crystal resonator 100a which satisfies the relationship expressed by L1=W1.

As described above, the stress distribution in the resonator element 10 changes in accordance with the distance L1 between the first bonding center 41b and the second bonding center 42b, and in a case where the distance L1 is short the stress applied into the resonation area 11c can be reduced compared with a case where the distance L1 is long.

However, in some cases, the stress applied into the resonation area 11c cannot be reduced only by defining the length of the distance L1. The reason for this is that the distance L2 between the resonation area center 11d and the intersection 53 can be flexibly set as long as the excitation electrode 13a does not directly come in contact with the first bonding member 41 and the second bonding member 42, and thus the resonation area 11c is disposed in the area in which the great stress is generated. The crystal resonator 100b in FIG. 2A to FIG. 3B satisfy the relationship expressed by L2=d2, for example, it is possible to set a value of the distance L2 in the crystal resonator 100b to be shorter than the distance d2 as long as the excitation electrode 13a does not directly come in contact with the first bonding member 41 and the second bonding member 42, and in a case where the distance L2 is shorter than the distance d2, the distribution of the stress in the resonation area 11c becomes larger than a case of satisfying the relationship expressed by L2=d2. Note that, the same is true for a case of the crystal resonator 100a.

From the above description, it is considered that the stress distribution in the resonation area 11c is not related to the absolute value of each of the distance L1 between the first bonding center 41b and the second bonding center 42b and the distance L2 between the resonation area center 11d and the intersection 53, but is related to a ratio of L1 to L2.

As described above, it is considered that the crystal resonator 100 including the resonator element 10 has the hysteresis in response to stress applied to the resonator element 10, and a positional relationship between the first bonding member 41 and the second bonding member 42, and the resonation area 11c is important so as to reduce the hysteresis of the crystal resonator 100. Accordingly, the inventors of the present application have obtained a result illustrated in FIGS. 3A and 3B by executing an experiment based on the assumption that the hysteresis of the crystal resonator 100 is related to L1/L2 which is the ratio of the distance L1 between the first bonding center 41b and the second bonding center 42b and the distance L2 between the resonation area center 11d and the intersection 53.

The resonator element 10 which is used in the aforementioned experiment is formed into a rectangular shape having a short side of 1.25 mm in the first direction 54 and a long side of 1.80 mm in the direction which intersects with the first direction 54 as illustrated in FIG. 1A. When viewed from above, the excitation electrodes 12a and 13a are formed into a rectangular shape and are disposed so as to substantially overlap with each other, the short side is disposed in the direction along the short side of the resonator element 10, and the long side is disposed in the direction along the long side of the resonator element 10.

The excitation electrodes 12a and 13a are formed into a rectangular having a short side of 0.90 mm and a long side of 1.08 mm.

The center of the resonator element 10 and the center of the respective excitation electrodes 12a and 13a substantially overlap the first virtual line 51. The resonation area 11c substantially overlaps the center of the each of the excitation electrodes 12a and 13a when viewed from above, and thus the resonation area 11c is disposed substantially in the same position as that of the excitation electrodes 12a and 13a with the same scale.

The first bonding center 41b and the second bonding center 42b are arranged in the direction along the first side 11e and the distance between the first bonding center 41b and the first side 11e and the distance between the second bonding center 42b and the first side 11e are 0.175 mm when viewed from above.

In addition, the resonator element 10, the excitation electrodes 12a and 13a, and the resonation area 11c are disposed to be substantially line symmetry with respect to the second virtual line 52 when viewed from above, and the distance between the resonation area center 11d and the intersection 53 is 0.825 mm. In addition, in the experiment of the embodiment, the upper surface 41a of the first bonding member 41 and the upper surface 42a of the second bonding member 42 are respectively a circle having a diameter of 0.35 mm centering the first bonding center 41b and a circle having a diameter of 0.35 mm centering the second bonding center 42b. In addition, in the experiment, the value of L1/L2 is changed by setting the distance L2 between the resonation area center 11d and the intersection 53 to be substantially constant and changing the distance L1 between the first bonding center 41b and the second bonding center 42b.

Figure 4:
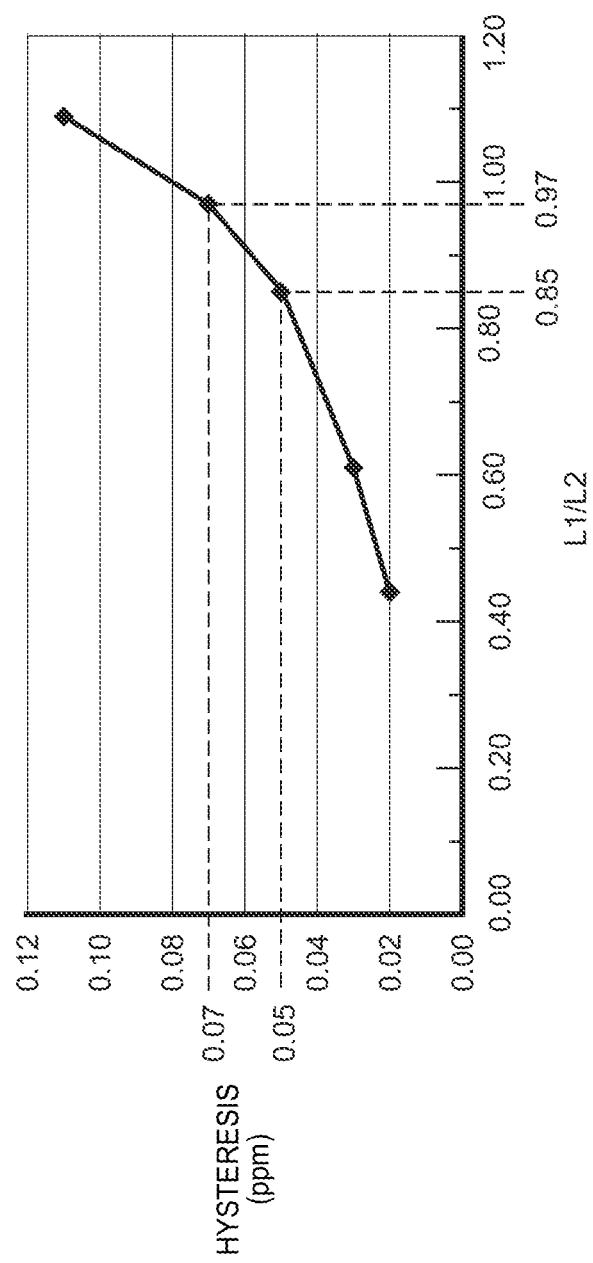
FIG. 4 is a diagram illustrating a relationship between L1/L2 and a hysteresis of a frequency-temperature characteristic of the crystal resonator.

FIG. 4 is a diagram illustrating a relationship between L1/L2 and the hysteresis of the crystal resonator 100. Here, as described later, the hysteresis is the maximum value of the absolute value of the difference between the resonance frequency when the temperature is decreased and the resonance frequency when the temperature is increased in each temperature, which is acquired by measuring the resonance frequency of the crystal resonator 100 in each temperature when the temperature is decreased and the resonance frequency of the crystal resonator 100 in each temperature when the temperature is increased.

In addition, in FIG. 4, the hysteresis of the crystal resonator 100 is measured and acquired in the following manner. In the experiment, the hysteresises of the crystal resonator 100 having five types of ratios of L1/L2 which are 0.36, 0.50, 0.70, 0.80, and 0.90 are measured and acquired. In the experiment, the hysteresis of the crystal resonator 100 is measured and acquired through the following methods.

First, the ambient temperature of the crystal resonator 100 is increased from room temperature (+25° C.) up to +85° C. Then, the resonance frequency of the crystal resonator 100 is measured at a 5° C. of temperature interval when the temperature is decreased by decreasing the ambient temperature of the crystal resonator 100 from +85° C. up to −40° C. Next, by heating the crystal resonator 100 such that the ambient temperature is increased from −40° C. up to +85° C., when the temperature is increased, the resonance frequency of the crystal resonator 100 is measured at a temperature at which the resonance frequency is measured when the temperature is decreased. Then, a frequency difference, which is the difference between the resonance frequency when the temperature is decreased and the resonance frequency when the temperature is increased, is acquired with respect to the resonance frequencies of the crystal resonator 100 which are measured when the temperature is decreased and increased under the same temperature condition. Subsequently, the frequency difference obtained under the respective temperature conditions is normalized by a nominal frequency (the resonance frequency at room temperature (+25° C.)) of the crystal resonator 100, and then the normalized frequencies under the respective temperature conditions are acquired. Lastly, a value of which the absolute value becomes the maximum is acquired among the normalized frequencies under the respective temperature conditions, and the acquired value is extracted as the hysteresis of the crystal resonator 100. The hysteresises of the crystal resonator 100 in each of ratios of L1/L2 is calculated by performing the above measurement on the crystal resonator 100 having the five types of ratios of L1/L2 which are used in the experiment.

From FIG. 4, it is found that when L1/L2 which is the ratio of the distance L1 between the first bonding center 41b and the second bonding center 42b, and the distance L2 between the resonation area center 11d and the intersection 53 is 0.97, the hysteresis of the crystal resonator 100 is 0.07 ppm. In addition, from FIG. 4, it is found that when a value smaller than 0.36 is input to the ratio of L1/L2, the hysteresis of the crystal resonator 100 becomes further smaller. Accordingly, in a range of 0<L1/L2≤0.97, the hysteresis of the crystal resonator 100 is 0.07 ppm or less. In addition, when L1/L2=0.85 is satisfied, the hysteresis of the crystal resonator 100 becomes 0.05 ppm. Accordingly, in a range of 0<L1/L2≤0.85, the hysteresis of the crystal resonator 100 is 0.05 ppm or less.

In a case where the crystal resonator 100 or an oscillator which uses the crystal resonator 100 is used for a product such as an electronic apparatus as a reference frequency source, the absolute value of the hysteresis of the crystal resonator 100 is required to be small so as not to reduce performance of the electronic apparatus. Particularly, in a case where the crystal resonator 100 or the oscillator which uses the crystal resonator 100 is used for, for example, a reference frequency source of a femtocell base station of a mobile phone and the like, the variation in the frequency-temperature characteristics of the crystal resonator 100 or the oscillator which uses the crystal resonator 100 is required to be 0.25 ppm or less, and in order to satisfy this value, the hysteresis is required to be 0.1 ppm or less. Accordingly, the hysteresis of the oscillator which uses the crystal resonator 100 and the crystal resonator 100 is preferably 0.07 ppm or less.

In addition, in a case where the crystal resonator 100 or the oscillator which uses the crystal resonator 100 is used for the electronic apparatus requiring higher frequency accuracy, for example, a device which is synchronized with a GPS signal, a macrocell base station of a mobile phone, a base station device for optical network (a basic system) and the like, the hysteresis of the crystal resonator 100 or the oscillator which uses the crystal resonator 100 is preferably 0.05 ppm or less.

As described above, according to the crystal resonator 100 in the embodiment, it is possible to obtain the following effects. In the crystal resonator 100, for example, even in a case where the stress is generated due to a difference between the elongation amount or the shrinkage amount of the resonator element 10 and the elongation amount or the shrinkage amount of the bottom plate 21 in accordance with the change of the ambient temperature of the crystal resonator 100, L1/L2 satisfies a relationship expressed by 0<L1/L2≤0.97, and thus it is possible to reduce the stress so as not to be transferred to the resonation area 11c of the resonator element 10. As a result, it is possible to reduce the variation in characteristics of the crystal resonator 100, for example, the value of hysteresis.

In addition, in the crystal resonator 100, for example, even in a case where the stress is generated due to a difference between the elongation amount or the shrinkage amount of the resonator element 10 and the elongation amount or the shrinkage amount of the bottom plate 21 in accordance with the change of the ambient temperature of the crystal resonator 100, L1/L2 satisfies a relationship expressed by 0<L1/L2≤0.85 and thus it is possible to further reduce the stress so as not to be transferred to the resonation area 11c of the resonator element 10. As a result, it is possible to further reduce the variation in characteristics of the crystal resonator 100, for example, the value of hysteresis compared with the case where L1/L2 satisfies the relationship expressed by 0<L1/L2≤0.97.

Meanwhile, in the experiment, the diameter of each of the upper surface 41a of the first bonding member 41 and the upper surface 42a of the second bonding member 42 is 0.35 mm, and thus as a lower limit of the distance L1 is preferably greater than 0.35 mm which is in a range that the first bonding member 41 and the second bonding member 42 are not electrically connected to each other. That is, it is preferable that L1/L2 satisfies a relationship expressed by 0.425<L1/L2≤0.97.

Further, in a case where the first bonding member and the second bonding member 42 are formed of an electroconductive adhesive, the diameter of each of the upper surface 41a of the first bonding member 41 and the upper surface 42a of the second bonding member 42 can be 0.15 mm or smaller, and thus as a lower limit of the distance L1 is preferably greater than 0.15 mm which is in a range that the first bonding member 41 and the second bonding member 42 are not electrically connected to each other. That is, it is preferable that L1/L2 satisfies a relationship expressed by 0.185<L1/L2≤0.97.

In addition, the measurement of the resonance frequency when the ambient temperature of the crystal resonator 100 is decreased is performed first in the experiment; however, the order of measurement is not limited, for example, the measurement of the resonance frequency when the ambient temperature of the crystal resonator 100 is increased may be performed first. In addition, the measurement may be not necessarily performed at the 5° C. of temperature interval as long as the hysteresis can be calculated, for example, the temperature interval may be in a range of 0.5° C. to 10° C. Further, the room temperature is set to be +25° C. in the experiment; however, room temperature may be, for example, in a range of 0° C. to +40° C.

In addition, in the embodiment, the crystal substrate 11 is used as the resonator element 10; however, the resonator element 10 may be formed of another piezoelectric single crystal such as lithium niobate and lithium tantalite. In a case where the resonator element 10 is formed of a piezoelectric single crystal other than the crystal, the orientation of crystal (a cut angle) or the like is selected so as to obtain the same characteristics as in the case of being formed of the crystal. An elastic surface wave element and a MEMS resonator element other than the piezoelectric resonator element can be used for the resonator element 10. In addition, the resonator element 10 may be formed of a piezoelectric material of piezoelectric ceramics such as lead zirconate titanate, or a silicon substrate other than the piezoelectric single crystal. Further, the shape of the resonator element 10 is not particularly limited, for example, it may be a bipod tuning fork, an H-type tuning fork, a tripod tuning fork, a comb type, an orthogonal type, a prismatic type or the like. As means for resonating the resonator element 10, a substance obtained by a piezoelectric effect or an electrostatic drive by coulomb force may be used. In addition, the resonator element 10 may be an element for detecting the physical quantity, for example, an element for an inertial sensor (an acceleration sensor, a gyro sensor, and the like), and a force sensor (a tilt sensor and the like).

In addition, the shapes and the sizes of the resonator element 10, and the excitation electrodes 12a and 13a may be variously modified without being limited to the shapes of the sizes which are used in the experiment. Further, the shapes and the sizes of the upper surface 41a of the first bonding member 41 and the upper surface 42a of the second bonding member 42 may be variously modified without being limited to the shapes and the sizes which are used in the experiment.

In addition, the first bonding member 41 and the second bonding member 42 use the conductive member in the embodiment; however, at least one of the first bonding member 41 and the second bonding member 42 may be a non-conductive member, for example, a resin or glass which does not contain a conductive member. In a case where the first bonding member 41 and the second bonding member 42 are non-conductive members, for example, the resonator element 10 is mechanically supported by the bottom plate 21 via the first bonding member 41 and the second bonding member 42, and the excitation electrode 12a and the internal connection terminal 24a, and the excitation electrode 13a and the internal connection terminal 24b can be electrically connected to each other via the conductive member such as a bonding wire. In addition, even in a case where one of the first bonding member 41 and the second bonding member 42 is a conductive member and the other one is a non-conductive member, it is possible to perform the mechanical and electrical connection on the bonding member side of the non-conductive member in the same way as above and to perform the mechanical and electrical connection on the bonding member side of the conductive member in the same way as in the first embodiment.

As described above, even when the non-conductive member is used as at least one of the first bonding member 41 and the second bonding member 42, it is possible to obtain some effects of the first embodiment. That is, even when the non-conductive member is used as at least one of the first bonding member 41 and the second bonding member 42, the resonator element 10 is mechanically connected to the bottom plate 21 via the first bonding member 41 and the second bonding member 42. Accordingly, when the resonation area 11c, the first bonding member 41, and the second bonding member 42 satisfy the relationship expressed by 0<L1/L2≤0.97, it is possible to reduce the stress, which is generated due to the difference between the elongation amount or the shrinkage amount of the resonator element 10 and the elongation amount or the shrinkage amount of the bottom plate 21, so as not to be transferred to the resonation area 11c of the resonator element 10 in accordance with the change of the ambient temperature of the crystal resonator 100. As a result, it is possible to reduce the variation in characteristics of the crystal resonator 100, for example, the value of the hysteresis.

Further, in the present embodiment, the crystal resonator 100 including the resonator element 10 is exemplified as an example of the resonation device; however, it is possible to employ various types of the resonation devices. The resonation device may be a sensor such as an inertial sensor (an acceleration sensor, a gyro sensor, and the like) and a force sensor (a tilt sensor and the like), which includes an element for detecting the physical quantity, a detection circuit for detecting a signal from the element, or an oscillation circuit for oscillating the element. The aforementioned oscillation circuit and detection circuit may be disposed, for example, on the inner space 26 side of the bottom plate 21, or may be disposed on the side, on which the plurality of external connection terminals 25 are formed, of the bottom plate 21. In addition, The aforementioned oscillation circuit and detection circuit are disposed on the side separated from the resonation device, and thus may be electrically connected to the resonator element 10 via the plurality of external connection terminals 25 of the resonation device.

Second Embodiment

As an example of the resonation device according to the second embodiment, a crystal resonator 200 will be described. Note that, the same constituent element as in the crystal resonator 100 in the first embodiment is given the same reference numerals, repeated description will be omitted, and the description will focus on the differences from the crystal resonator 100 in the first embodiment.

Figure 5A:
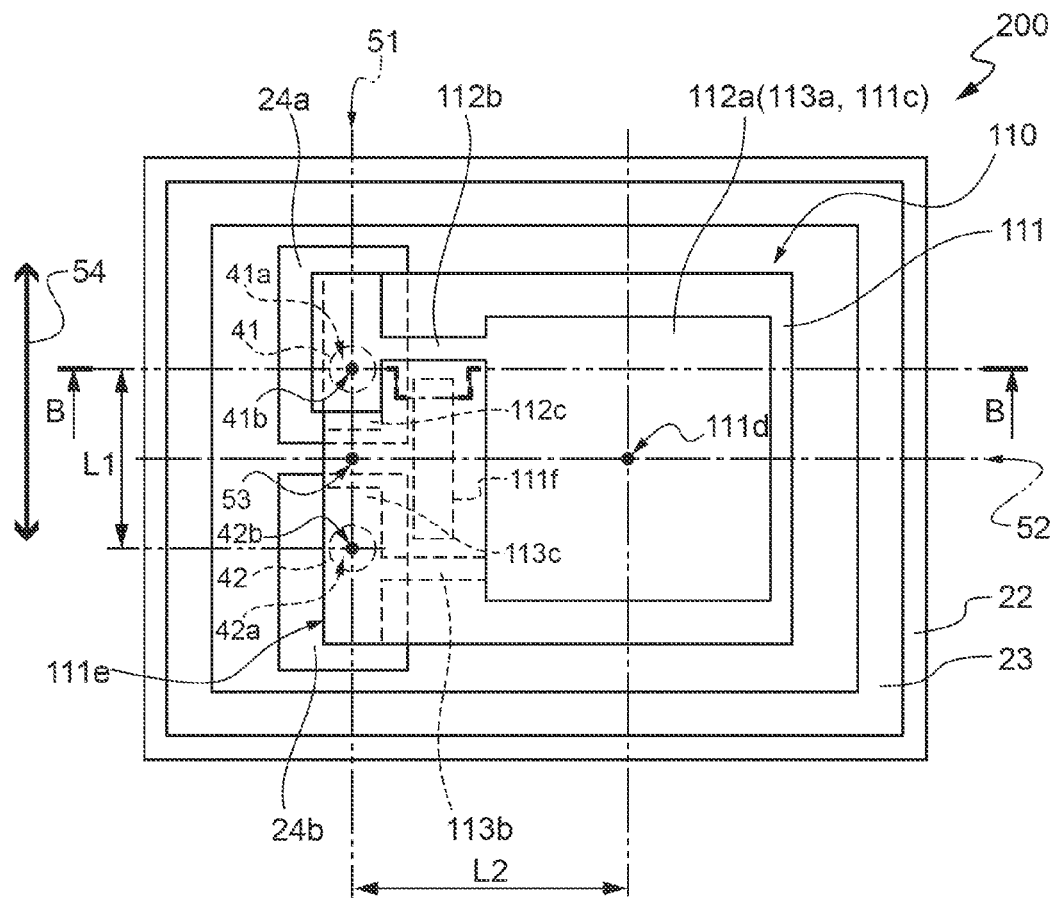
FIGS. 5A and 5B are schematic configuration diagrams of a crystal resonator 200 as a resonation device according to a second embodiment.
Figure 5B:
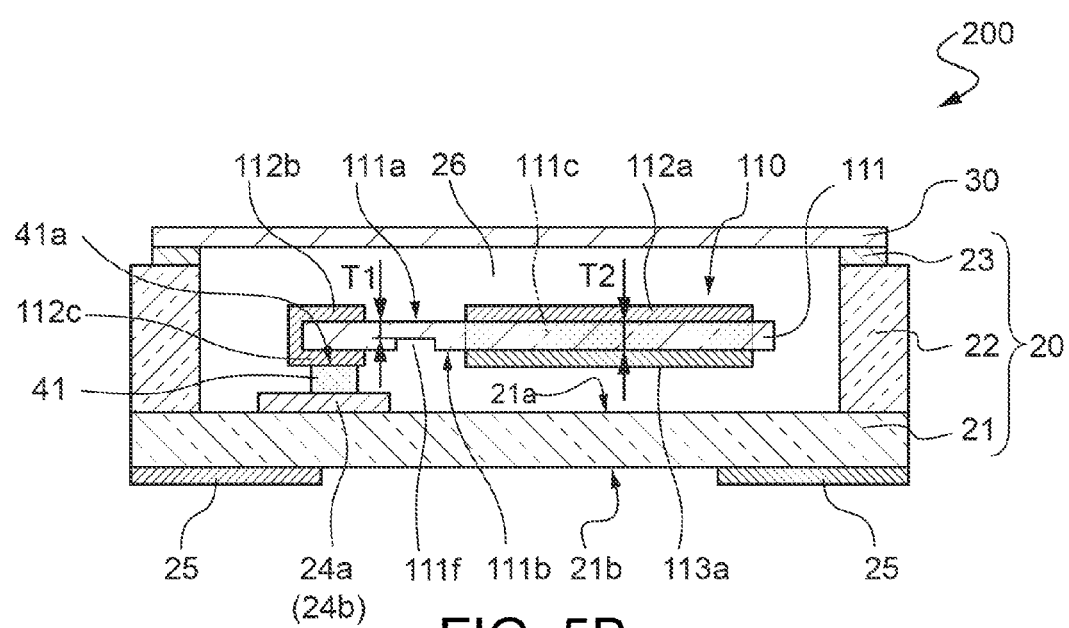

FIGS. 5A and 5B are schematic configuration diagrams of the crystal resonator 200 as the resonation device according to the second embodiment, and FIG. 5A is a plan view and FIG. 5B is a sectional view taken along line B-B of FIG. 5A.

Resonator Element

As illustrated in FIGS. 5A and 5B, unlike the first embodiment, a resonator element 110 of the crystal resonator 200 includes a hollow 111f, which is on a lower surface 111b side of a crystal substrate 111 being formed, between the first virtual line 51 which connects the first bonding center 41b and the second bonding center 42*b* and an excitation electrode 113*a* on the lower surface 111*b* when viewed from above. In addition, the hollow 111*f* extends to the second bonding center 42*b* from the first bonding center 41*b* in the direction along the first direction 54.

In the hollow 111*f*, a distance in a direction which intersects with an upper surface 111*a* and the lower surface 111*b* of the crystal substrate 111, that is, a thickness T1 of the hollow 111*f* is smaller than a thickness T2 of the crystal substrate 111 in which the hollow 111*f* is not formed. In addition, the hollow 111*f* is formed in the inside further than an end portion of the crystal substrate 111 in the first direction 54 when viewed from above.

In the crystal resonator 200 in the embodiment, the stress which is generated due to the difference between the elongation amount or the shrinkage amount of the resonator element 110 and the elongation amount or the shrinkage amount of the bottom plate 21 in accordance with the change of the ambient temperature of the crystal resonator 200 is transferred to a resonation area 111*c* of the resonator element 110, that is, the stress is transferred to the resonation area 111*c* which is an area which overlaps excitation electrodes 112*a* and 113*a* in the crystal substrate 111 of FIG. 5A, and a hatched area in the crystal substrate 111 of FIG. 5B via an area in the hollow 111*f*. The thickness T1 of the hollow 111*f* on the crystal substrate 111 is smaller than the thickness T2 of the crystal substrate 111. In a case where the stress is transferred to the area in the thickness T2 via the area in the thickness T1, the stress is absorbed into the area in the thickness T1 which is largely distorted compared with the area in the thickness T2, and thus the stress transferred to the area in the thickness T2 is reduced. Accordingly, the stress which is generated due to the difference between the elongation amount or the shrinkage amount the resonator element 110 and the elongation amount or the shrinkage amount of the bottom plate 21 as the substrate in accordance with the change of the ambient temperature of the crystal resonator 200 is less likely to be transferred to the resonation area 111*c* by distorting the hollow 111*f*.

As described above, according to the crystal resonator 200 in the embodiment, in a case where the resonation area 111*c*, the first bonding member 41, and the second bonding member 42 satisfy a relationship expressed by 0<L1/L2≤0.97, in addition to the effect resulting from the crystal resonator 100 in the first embodiment, the following effects can be obtained. In the crystal resonator 200 of the embodiment, compared with the first embodiment, the stress which is generated due to the difference between the elongation amount or the shrinkage amount the resonator element 110 and the elongation amount or the shrinkage amount of the bottom plate 21 in accordance with the change of the ambient temperature, and is transferred to the resonation area 11*c* is further reduced. Accordingly, it is possible to further reduce the variation in characteristics of the crystal resonator 200, for example, the value of hysteresis compared with the first embodiment.

Meanwhile, the hollow 111*f* may be formed in any position other than the position defined in the embodiment. For example, when viewed from above, the hollow 111*f* may be separately formed in two or more portions which are between the first bonding center 41*b* and the excitation electrodes 112*a* and 113*a*, and between the second bonding center 42*b* and the excitation electrodes 112*a* and 113*a*. Further, two or more hollows 111*f* may be formed between the first virtual line 51 and the excitation electrodes 112*a* and 113*a* in the direction which intersects with the first direction 54.

Third Embodiment

As an example of a resonation device according to the third embodiment, a crystal resonator 300 will be described. Note that, the same constituent element as in the crystal resonator 100 in the first embodiment is given the same reference numerals, repeated description will be omitted, and the description will focus on the differences from the crystal resonator 100 in the first embodiment.

Figure 6A:
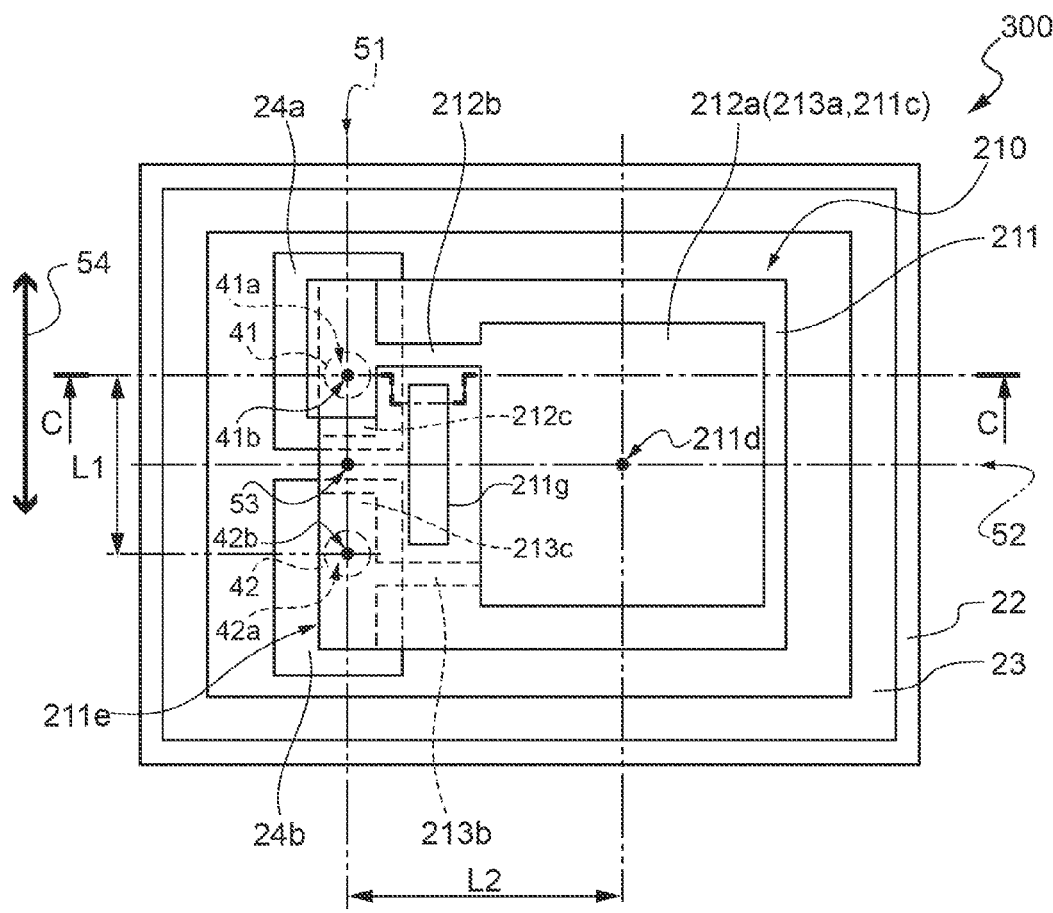
FIGS. 6A and 6B are schematic configuration diagrams of a crystal resonator 300 as a resonation device according to a third embodiment.
Figure 6B:
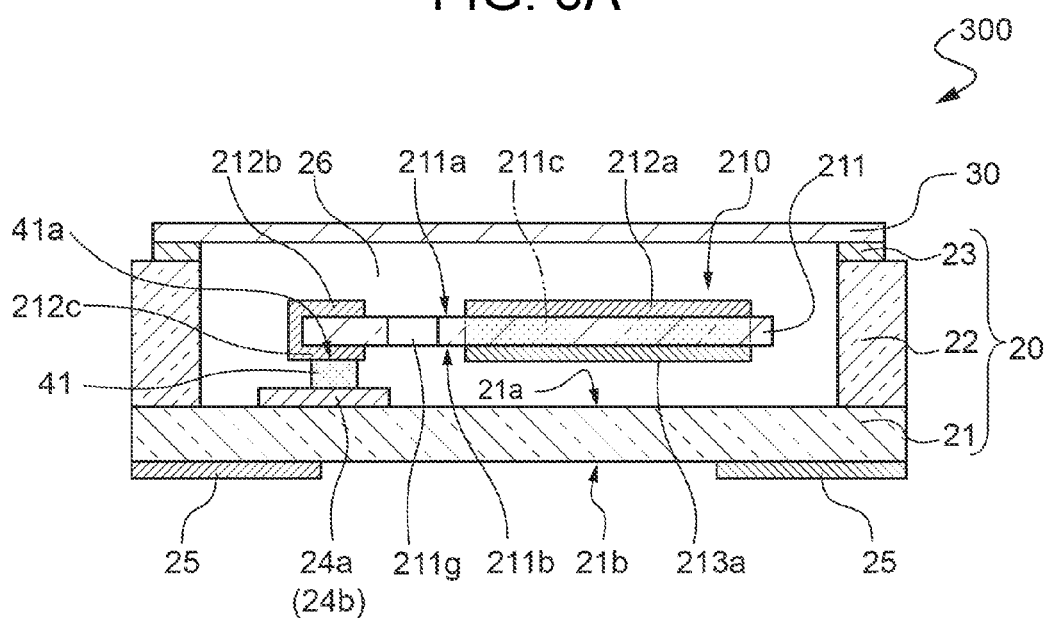

FIGS. 6A and 6B are schematic configuration diagrams of a crystal resonator 300 as the resonation device according to the third embodiment, and FIG. 6A is a plan view and FIG. 6B is a sectional view taken along line C-C of FIG. 6A.

Resonator Element

As illustrated in FIGS. 6A and 6B, unlike the first embodiment, a resonator element 210 of the crystal resonator 300 includes a hole 211*g*, which penetrates from the upper surface 211*a* to the lower surface 211*b* on the crystal substrate 211, between the first virtual line 51 which connects the first bonding center 41*b* and the second bonding center 42*b* and excitation electrodes 212*a* and 213*a*, when viewed from above. In addition, the hole 211*g* extends to the second bonding center 42*b* from the first bonding center 41*b* in the direction along the first direction 54.

In the crystal resonator 300 of the present embodiment, the stress which is generated due to the difference between the elongation amount or the shrinkage amount of the resonator element 210 and the elongation amount or the shrinkage amount of the bottom plate 21 in accordance with the change of the ambient temperature is transferred to a resonation area 211*c* of the resonator element 210, that is, the stress is transferred to the resonation area 211*c* which is an area which overlaps excitation electrodes 212*a* and 213*a* in the crystal substrate 211 of FIG. 6A, and a hatched area in the crystal substrate 211 of FIG. 6B via both an area which is not adjacent to the hole 211*g* and an area which is adjacent to the hole 211*g* of the crystal substrate 211. The area adjacent to the hole 211*g* of the crystal substrate 211 is more easily distorted than the area which is not adjacent to the hole 211*g*. As a result, the stress which is generated due to the difference between the elongation amount or the shrinkage amount of the resonator element 210 and the elongation amount or the shrinkage amount of the bottom plate 21 in accordance with the change of the ambient temperature of the crystal resonator 300 is less likely to be transferred to the resonation area 211*c* by distorting the area adjacent to the hole 211*g*.

As described above, according to the crystal resonator 300 in the embodiment, in a case where the resonation area 211*c*, the first bonding member 41, and the second bonding member 42 satisfy a relationship expressed by 0<L1/L2≤0.97, in addition to the effect resulting from the crystal resonator 100 in the first embodiment, the following effects can be obtained. In the crystal resonator 300 of the embodiment, compared with the first embodiment, the stress which is generated due to the difference between the elongation amount or the shrinkage amount the resonator element 210 and the elongation amount or the shrinkage amount of the bottom plate 21 in accordance with the change of the ambient temperature of the crystal resonator 300, and is transferred to the resonation area 211*c* is further reduced. Accordingly, compared with the first embodiment, it is possible to further reduce the variation in characteristics of the crystal resonator 300, for example, the value of hysteresis compared with the first embodiment.

Meanwhile, the hole 211*g* may be formed in any position other than the position defined in the embodiment. For example, when viewed from above, the hole 211g may be separately formed in two or more portions which are between the first bonding center 41b and the excitation electrodes 212a and 213a, and between the second bonding center 42b and the excitation electrodes 212a and 213a. Further, two or more holes 211g may be formed between the first virtual line 51 and the excitation electrodes 212a and 213a in the direction which intersects with the first direction 54.

Fourth Embodiment

As an example of the resonation device according to the fourth embodiment, a crystal resonator 400 will be described. Note that, the same constituent element as in the crystal resonator 100 in the first embodiment is given the same reference numerals, repeated description will be omitted, and the description will focus on the differences from the crystal resonator 100 in the first embodiment.

FIGS. 7A and 7C are schematic configuration diagrams of the crystal resonator 400 as a resonation device according to the fourth embodiment, and FIG. 7A is a plan view, FIG. 7B is a sectional view taken along line D-D of FIG. 7A, and FIG. 7C is a sectional view of a part of an excitation electrode portion of FIG. 7B.

Resonator Element

The resonator element 310 of the crystal resonator 400 in the embodiment has a so-called mesa structure in which a first area 311h having a first thickness T3 and a second area 311k having a thickness T4 which is smaller than the thickness T3 are included within a distance in a direction which intersects with an upper surface and a lower surface of a crystal substrate 311, that is, the thickness of a crystal substrate 311. The crystal substrate 311 has a shape in which the first area 311h is surrounded by the second area 311k when viewed from above.

As illustrated in FIG. 7A, excitation electrodes 312a and 313a are formed into a rectangular shape when viewed from above, and are disposed so as to substantially overlap with each other. That is, when viewed from above, the center of the excitation electrode 312a and the center of the excitation electrode 313a are disposed so as to substantially overlap with each other. In addition, the crystal substrate 311 includes a resonation area 311c which is interposed between the excitation electrodes 312a and 313a, that is, an area which overlaps the excitation electrodes 312a and 313a in the crystal substrate 311 of FIG. 7A, and a hatched area in the crystal substrate 311 of FIG. 7B. Further, the excitation electrodes 312a and 313a are disposed so as to overlap the first area 311h in the first direction 54, and are disposed so as to overlap the first area 311h and the second area 311k in the direction which intersects with the first direction 54 when viewed from above.

The resonation area 311c includes the resonation area center 311d. Since the excitation electrodes 312a and 313a are disposed as described above, the resonation area 311c is formed into a rectangular shape when viewed from above, and the resonation area center 311d and the center of each of excitation electrodes 312a and 313a substantially overlap with each other.

The resonation area center 311d and the center of the first area 311h are disposed so as to substantially overlap with each other when viewed from above. In addition, in the embodiment, the first area 311h overlaps a large part of the resonation area 311c. The large part of the resonation area 311c is preferably equal to or greater than 80%, for example. Meanwhile, the center of each of the excitation electrodes 312a and 313a, the resonation area center 311d, and the center of the first area 311h are respectively the centroid (the center of a drawing) of a shape when the excitation electrodes 312a and 313a are viewed from above, the centroid (the center of a drawing) of a shape when the resonation area 311c is viewed from above, and the centroid (the center of a drawing) of a shape when the first area 311h is viewed from above.

In addition, as illustrated in FIGS. 7B and 7C, the excitation electrode 312a is disposed so as to cover the upper surface of the first area 311h, a side surface 311m which connects the upper surface of the first area 311h and the upper surface of the second area 311k, and the upper surface of the second area 311k in the direction which intersects with the first direction 54. The excitation electrode 313a is disposed so as to cover the lower surface of the first area 311h, a side surface 311n which connects the lower surface of the first area 311h and the lower surface of the second area 311k, and the lower surface of the second area 311k in the direction which intersects with the first direction 54.

In the crystal resonator 400 in the embodiment, when viewed from above, the resonation area center 311d overlaps the first area 311h having a first thickness T3 and the first bonding center 41b and the second bonding center 42b overlap the second area 311k having the thickness T4 which is smaller than the thickness T3. That is, the resonator element 310 is supported by the bottom plate 21 via the first bonding member 41 and the second bonding member 42 in the second area 311k having the thickness T4 which is smaller than the thickness T3 of the first area 311h in which a large amount of resonation energy is concentrated while the resonator element 310 resonates. For this reason, the stress, which is generated due to the difference between the elongation amount or the shrinkage amount the resonator element 310, and the elongation amount or the shrinkage amount of the bottom plate 21 as the substrate in accordance with the change of the ambient temperature of crystal resonator 400 is transferred to the resonation area 311c via the second area 311k. In a case where the stress is transferred to the area in the thickness T3 via the area in the thickness T4, the stress is absorbed into the area in the thickness T4 which is largely distorted compared with the area in the thickness T3, and thus the stress transferred to the area in the thickness T3 is reduced. Accordingly, the stress, which is generated due to the difference between the elongation amount or the shrinkage amount of the resonator element 310, and the elongation amount or the shrinkage amount of the bottom plate 21 in accordance with the change of the ambient temperature of crystal resonator 400 is less likely to be transferred to the resonation area 311c by distorting the second area 311k of the resonator element 310.

As described above, according to the crystal resonator 400 in the embodiment, in a case where the resonation area 311c, the first bonding member 41, and the second bonding member 42 satisfy a relationship expressed by 0<L1/L2≤0.97, in addition the effect resulting from the crystal resonator 100 in the first embodiment, the following effects can be obtained. In the crystal resonator 400 of the embodiment, compared with the first embodiment, the stress which is generated due to the difference between the elongation amount or the shrinkage amount the resonator element 310 and the elongation amount or the shrinkage amount of the bottom plate 21 in accordance with the change of the ambient temperature of the crystal resonator 400, and is transferred to the resonation area 311c is further reduced. Accordingly, compared with the first embodiment, it is possible to further reduce the variation in characteristics of the crystal resonator 400, for example, the value of hysteresis.

Meanwhile, the resonator element 310 in the embodiment is disposed in such a manner that when viewed from above, the center of each of the excitation electrodes 312a and 313a, the resonation area center 311d, and the center of the first area 311h substantially overlap with each other; however, it is not limited thereto as long as the excitation electrodes 312a and 313a are disposed such that the resonation area center 311d and the first area 311h overlap with each other when viewed from above. In addition, the excitation electrodes 312a and 313a may be disposed such that when viewed from above, one excitation electrode is disposed in the inner side of the other excitation electrode, or both excitation electrodes 312a and 313a may be disposed so as to overlap only the first area 311h.

Modification Example of Resonator Element

In the resonation device of the embodiment, the resonator element is not necessarily to be a shape of the resonator element 310 as illustrated in FIGS. 7A to 7C. Modification Example of the resonator element will be described with reference to FIGS. 8A to 8E. Note that, the same constituent element as that of the resonator element 10 in the first embodiment or the resonator element 310 in the fourth embodiment is given the same reference numerals, repeated description will be omitted, and the description will focus on the differences from the resonator element 10 the first embodiment or the resonator element 310 in the fourth embodiment.

FIGS. 8A to 8E are schematic configuration diagrams illustrating Modification Example of the resonator element according to the embodiment, FIG. 8A is a plan view of the resonator element 410 which is an example of Modification Example, FIG. 8B is a sectional view taken along line E-E in FIG. 8A, FIG. 8C is a plan view of the resonator element 510 which is another example of Modification Example, FIG. 8D is a sectional view taken along line F-F in FIG. 8C, and FIG. 8E is a partially enlarged sectional view of an excitation electrode portion in FIG. 8D. Note that, in the following description, an upper side in FIGS. 8B and 8D is referred to as "up" and a lower side is referred to as "down". In addition, a surface on the upper side of each member in FIGS. 8B and 8D is referred to as an upper surface, and a surface on the lower side is referred to as a lower surface.

As illustrated in FIGS. 8A and 8B, the resonator element 410 is configured such that the upper surface of the first area 411h of the crystal substrate 411 in the thickness T3 protrudes from the upper surface of the second area 411k in the thickness T4, and the lower surface of the first area 411h and the lower surface of the second area 411k are connected to each other in a planar shape. Excitation electrodes 412a and 413a are disposed so as to substantially overlap with each other when viewed from above. In addition, the crystal substrate 411 includes a resonation area 411c which is interposed between the excitation electrodes 412a and 413a, that is, an area which overlaps the excitation electrodes 412a and 413a in the crystal substrate 411 of FIG. 8A, and a hatched area in the crystal substrate 411 of FIG. 8B. Further, the resonation area center 411d is disposed so as to substantially overlap the center of the first area 411h.

In addition, the excitation electrode 412a is disposed so as to cover the upper surface of the first area 411h, a side surface 411m which connects the upper surface of the first area 411h and the upper surface of the second area 411k, and the upper surface of the second area 411k in the direction which intersects with the first direction 54.

As illustrated in FIGS. 8C and 8D, the resonator element 510 includes an area in a thickness T5 in which the thickness of the first area 511h of the crystal substrate 511 is greater than the thickness T4 of the second area 511k, and an area in a thickness T6 which is greater than the thickness T5. In addition, the excitation electrodes 512a and 513a are disposed such that the area in the thickness T6 and the area in the thickness T5 of the first area 511h overlap the second area 511k when viewed from above. In addition, the crystal substrate 511 includes a resonation area 511c which is interposed between the excitation electrodes 512a and 513a, that is, an area which overlaps the excitation electrodes 512a and 513a in the crystal substrate 511 of FIG. 8C, and a hatched area in the crystal substrate 511 of FIG. 8D. Further, the resonation area center 511d is disposed so as to overlap the area in the thickness T6 of the first area 511h.

In addition, as illustrated in FIGS. 8D and 8E, the excitation electrode 512a is disposed so as to cover the upper surface of the area of the first area 511h in the thickness T6, a side surface 511m which connects the upper surface of the area of the first area 511h in the thickness T6 and the upper surface of the area of the first area 511h in the thickness T5, the upper surface of the area of the first area 511h in the thickness T5, a side surface 511n which connects the upper surface of the area of the first area 511h in the thickness T5 and the upper surface of the second area 511k, and the upper surface of the second area 511k in the direction which intersects with the first direction 54. The excitation electrode 513a is disposed so as to cover the lower surface of the area of the first area 511h in the thickness T6, a side surface 511p which connects the lower surface of the area of the first area 511h in the thickness T6 and the lower surface of the area of the first area 511h in the thickness T5, the lower surface of the area of the first area 511h in the thickness T5, a side surface 511q which connects the lower surface of the area of the first area 511h in the thickness T5 and the lower surface of the second area 511k, and the lower surface of the second area 511k in the direction which intersects with the first direction 54.

The crystal resonator 400 which is formed of the resonator element 410 or the resonator element 510 can exhibit the same effect as the effect resulting from crystal resonator 400 which is formed of the resonator element 310 in the embodiment.

Meanwhile, the resonator element 410 in Modification Example as described above is disposed in such a manner that when viewed from above, the center of each of the excitation electrodes 412a and 413a, the resonation area center 411d, and the center of the first area 411h substantially overlap with each other; however, it is not limited thereto as long as the excitation electrodes 412a and 413a are disposed such that the resonation area center 411d and the first area 411h overlap with each other when viewed from above. In addition, the excitation electrodes 412a and 413a may be disposed such that when viewed from above, one excitation electrode is disposed in the inner side of the other excitation electrode, or both excitation electrodes 412a and 413a may be disposed so as to overlap only the first area 411h.

In addition, the resonator element 510 in Modification Example as described above is disposed in such a manner that when viewed from above, the center of each of the excitation electrodes 512a and 513a, the resonation area center 511d, and the center of the first area 511h substantially overlap with each other; however, it is not limited thereto as long as the excitation electrodes 512a and 513a are disposed such that the resonation area center 511d and the area of the first area 511h in the thickness T6 overlap with each other when viewed from above. In addition, the excitation electrodes 512a and 513a may be disposed such that when viewed from above, one excitation electrode is disposed in the inner side of the other excitation electrode, or both excitation electrodes 512a and 513a may be disposed so as to overlap only the first area 511h.

Fifth Embodiment

As an example of the resonation device according to the fifth embodiment, a crystal resonator 500 will be described. Note that, the same constituent element as that of the crystal resonator 100 in the first embodiment is given the same reference numerals, repeated description will be omitted, and the description will focus on the differences from the crystal resonator 100 in the first embodiment.

Figure 9A:
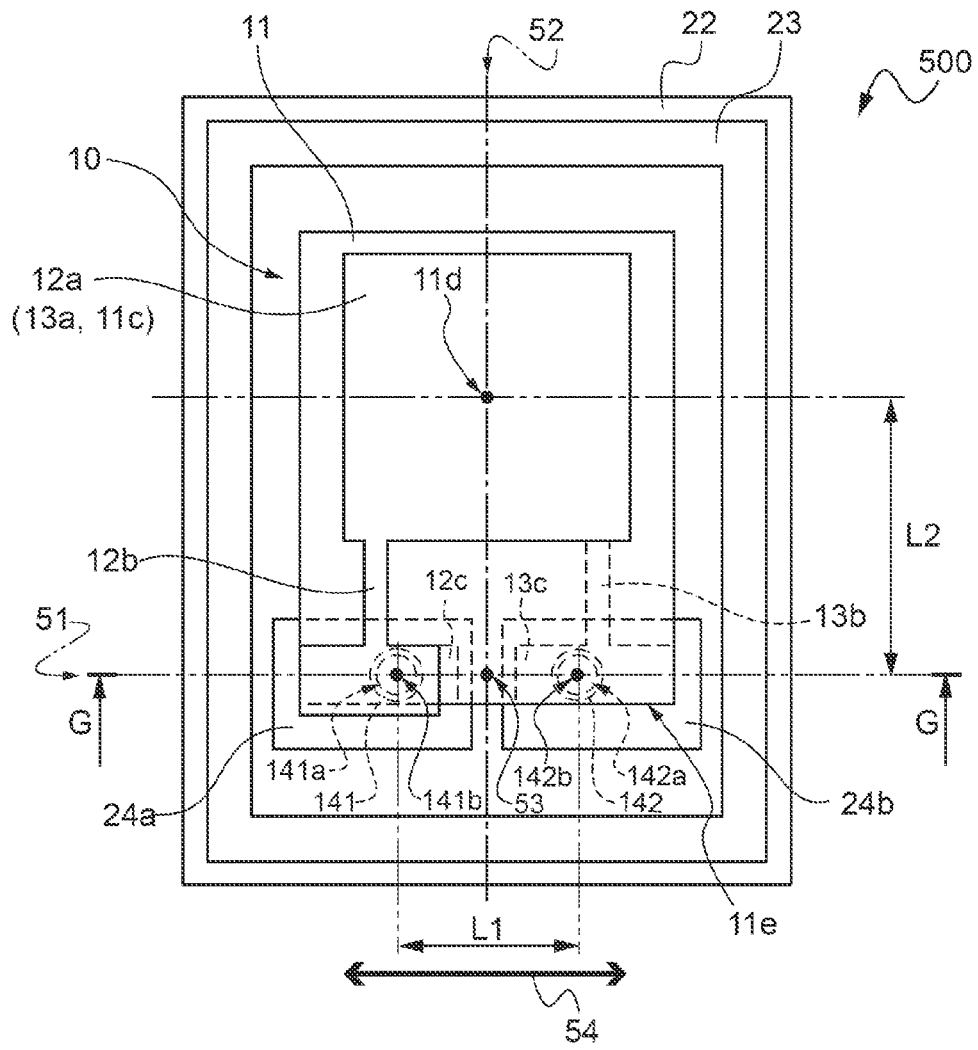
FIGS. 9A and 9B are schematic configuration diagrams of a crystal resonator 500 as a resonation device according to a fifth embodiment.
Figure 9B:
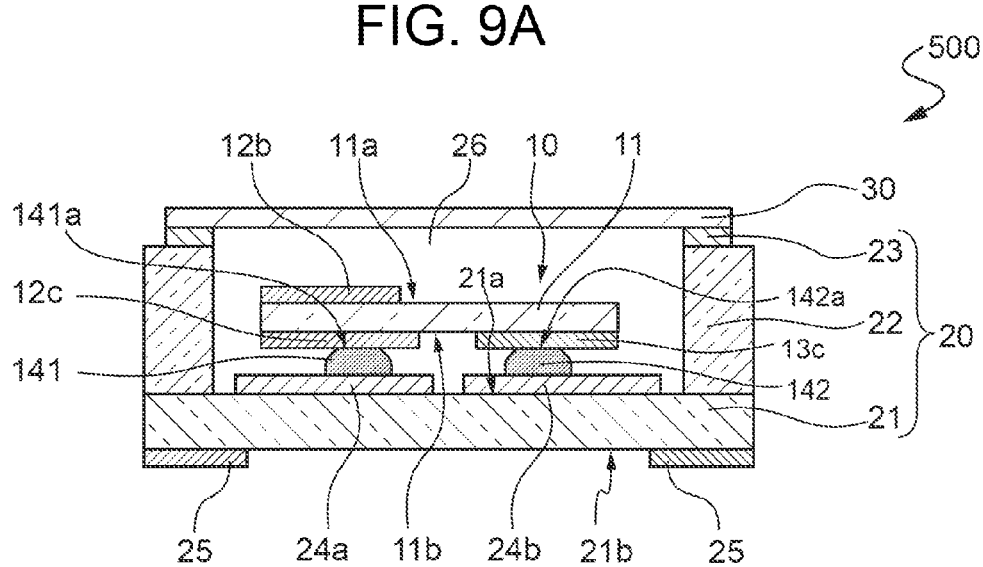

FIGS. 9A and 9B are schematic configuration diagrams of a crystal resonator 500 as a resonation device according to the fifth embodiment, and FIG. 9A is a plan view and FIG. 9B is a sectional view taken along line G-G of FIG. 9A.

Bonding Member

As illustrated in FIGS. 9A and 9B, unlike the crystal resonator 100 in the first embodiment, a first bonding member 141 and a second bonding member 142 of the crystal resonator 500 in the embodiment are formed of a metallic bump. The connection electrode 12c side of the first bonding member 141, that is, an upper surface 141a on the resonator element 10 side includes a first bonding center 141b. The connection electrode 13c side of the second bonding member 142, that is, an upper surface 142a of the resonator element 10 side includes a second bonding center 142b.

The metallic bump is formed by a plating method, a bonding method, or the like. The plating method is performed by plating metal after forming a predetermined pattern such that the first bonding member 141 and the second bonding member 142 are formed in a predetermined position of the resonator element 10 or the package 20, and thereby the metallic bumps which are the first bonding member 141 and the second bonding member 142 can be formed.

In addition, the bonding method is performed by connecting a metallic wire (thin wire) such as gold (Au) to a position in which each of the first bonding member 141 and the second bonding member 142 of the resonator element 10 or the package 20 is formed, and cutting the wire except for the connected part, and thereby the metallic bumps which are the first bonding member 141 and the second bonding member 142 can be formed.

In addition, instead of the plating method and the bonding method, a method of forming the metallic bumps which are the first bonding member 141 and the second bonding member 142 by coating the position, in which the first bonding member 141 and the second bonding member 142 of the resonator element or the package 20 are formed, with a paste (solvent) containing a metallic member by printing or dispensing, then heating the resonator element 10 or the package 20 which is coated with the paste so as to volatilize solvent components except for the metal, can be used.

The shape of the metallic bump is not particularly limited, for example, it may be a columnar (cylindrical) shape, a polygonal prism, a truncated cone, and the like. In addition, the metallic wire may be formed of metal mainly containing silver (Ag), copper (Cu), aluminum (Al), platinum (Pt), and the like in addition to gold (Au). Further, a material of the metallic member may be metal mainly containing gold (Au), silver (Ag), copper (Cu), aluminum (Al), platinum (Pt), and the like, or an alloy such as a lead-free solder or a leaded solder.

The metallic bump has less gas emission from the inside of the metallic bump due to the heat and the time elapse compared with a resin member such as an adhesive. For this reason, even when the crystal resonator 500 is heated, and time has elapsed after manufacturing the crystal resonator 500, the gas emission from the first bonding member 141 and the second bonding member 142 is reduced compared with a case where the first bonding member 141 and the second bonding member 142 are formed of a resin member.

In addition, since the gas emitted from the first bonding member 141 and the second bonding member 142 is emitted to the inner space 26 in an air-tight state, the emitted gas is attached to the excitation electrodes 12a and 13a so as to increase a mass amount, and the emitted gas changes the excitation electrodes 12a and 13a, and thus the characteristics of the resonator element 10, for example, a resonance frequency, a frequency-temperature characteristic, and an equivalent series resistance are changed in some cases.

From the above description, due to the heat and the time elapse, the gas emitted from the first bonding member 141 and the second bonding member 142 of the crystal resonator 500 in the embodiment is more reduced than the gas emitted from the first bonding member 41 and the second bonding member 42 of the crystal resonator 100 in the first embodiment. Accordingly, as compared with the crystal resonator 100 in the first embodiment, it is possible to reduce the variation of the characteristics of the crystal resonator 500, for example, the resonance frequency, the frequency-temperature characteristics, and the equivalent series resistance.

As described above, according to the crystal resonator 500 in the embodiment, in a case where the resonation area 11c, the first bonding member 141, and the second bonding member 142 satisfy a relationship expressed by $0<L1/L2\leq0.97$, in addition the effect resulting from the crystal resonator 100 in the first embodiment, the following effects can be obtained. As compared with the crystal resonator 100 in the first embodiment, it is possible to reduce the gas emitted from the first bonding member 141 and the second bonding member 142 of the crystal resonator 500, and thus it is possible to reduce the variation of the characteristics of the crystal resonator 500, for example, the output frequency, the frequency-temperature characteristics, and the equivalent series resistance.

Note that, the first bonding member 141 and the second bonding member 142 are formed of the metallic bump in the embodiment; however, even in a case where at least one bonding member of the first bonding member 141 and the second bonding member 142 may be formed of the metallic bump, and the other bonding member may be formed of a conductive or non-conductive adhesive, and the like, it is possible to result in the same effect as that in the embodiment from the above-described description.

In addition, in a case where the first bonding member 141 and the second bonding member 142 are formed of the metallic bump, a diameter of each of the upper surface 141a of the first bonding member 141 and the upper surface 142a of the second bonding member 142 can be set to be equal to or less than 0.05 mm, and thus it is preferable that a lower limit of L1 is greater than 0.05 mm as a range in which the first bonding member 141 and the second bonding member 142 are not electrically connected to each other. in other words, it is preferable that L1/L2 satisfies a relationship expressed by $0.065 < L1/L2 \leq 0.97$.

Sixth Embodiment

As an example of the resonation device according to the sixth embodiment, a crystal resonator 600 will be described. Note that, the same constituent element as that of the crystal resonator 100 in the first embodiment is given the same reference numerals, repeated description will be omitted, and the description will focus on the differences from the crystal resonator 100 in the first embodiment.

Figure 10A:
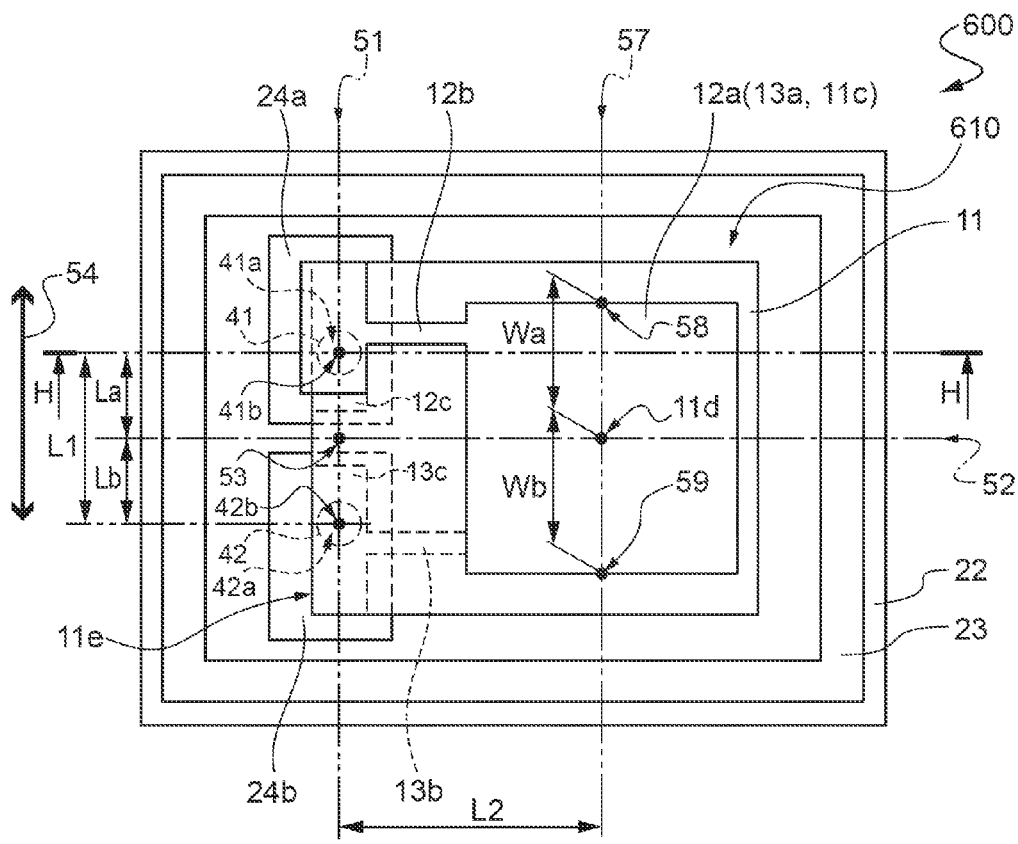
FIGS. 10A and 10B are schematic configuration diagrams of a crystal resonator 600 as a resonation device according to a sixth embodiment.
Figure 10B:
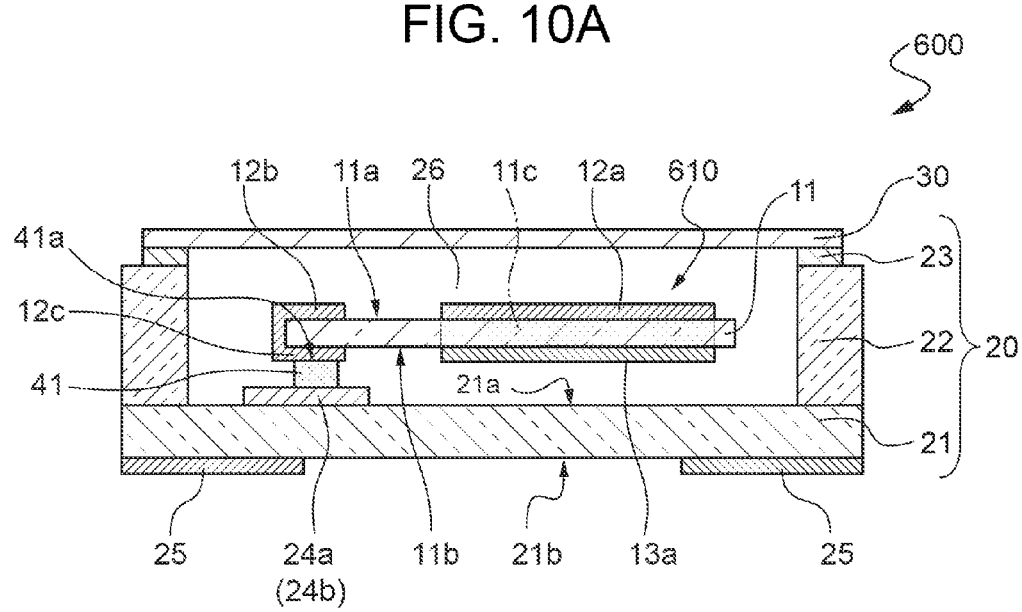

FIGS. 10A and 10B are schematic configuration diagrams of the crystal resonator 600 as a resonation device according to the sixth embodiment, and FIG. 10A is a plan view and FIG. 10B is a sectional view taken along line H-H of FIG. 10A.

As illustrated in FIGS. 10A and 10B, the crystal resonator 600 in the embodiment satisfies the relationship expressed by $0 < L1/L2 \leq 0.97$ in the crystal resonator 100 of the first embodiment, and is configured as follows.

Here, in the crystal resonator 600, when a virtual line which passes through the resonation area center 11d and is parallel to the first direction 54 is set to be a third virtual line 57, a distance between the first bonding center 41b and the second virtual line 52 as a perpendicular line is set to be La, a distance between the second bonding center 42b and the second virtual line 52 is set to be Lb, a distance between the resonation area center 11d and an end portion 58 of the resonation area 11c, which is positioned on the first bonding member 41 side with respect to the second virtual line 52 and intersects with the third virtual line 57, is set to be Wa, and a distance between the resonation area center 11d and an end portion 59 of the resonation area 11c, which is positioned on the second bonding member 42 side with respect to the second virtual line 52 and intersects with the third virtual line 57, is set to be Wb.

Hereinafter, a relationship between La, Lb, Wa, and Wb and the hysteresis in the crystal resonator 600 will be described.

Figure 11:
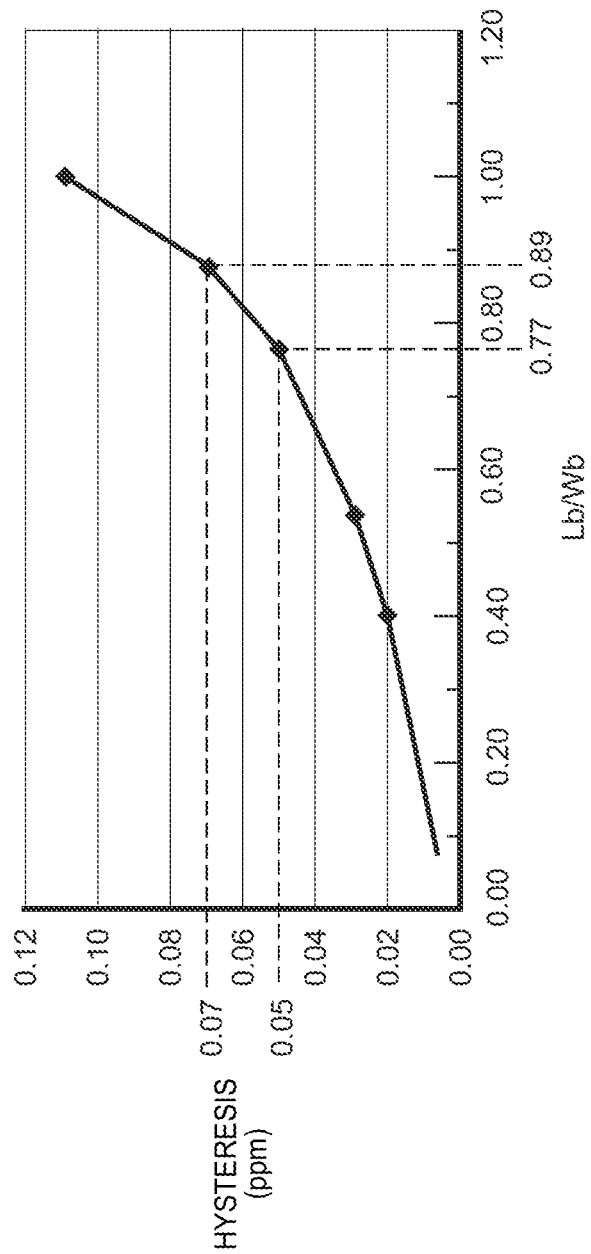
FIG. 11 is a diagram illustrating a relationship between Lb/Wb and a hysteresis of the crystal resonator 600.

The inventors of the present application have obtained a result as indicated in FIG. 11 by executing an experiment based on the assumption that in addition to the configuration of the first embodiment, the hysteresis of the crystal resonator 600 is related to La/Wa which is the ratio of the distance La between the first bonding center 41b and the second virtual line 52 to the distance Wa between the resonation area center 11d and an end portion 11c1 of the resonation area 11c, or related to Lb/Wb which is the ratio of the distance Lb between the second bonding center 42b and the second virtual line 52 to the distance Wb between the resonation area center 11d and an end portion 11c2 of the resonation area 11c.

A resonator element 610 which is used in the aforementioned experiment is basically formed into substantially the same shape as that of the resonator element 10 in first embodiment, and the excitation electrodes 12a and 13a, and the resonation area 11c are disposed to be substantially line symmetry with respect to the second virtual line 52 when viewed from above. Accordingly, in the experiment, it can be said that the relationships Wa=Wb=0.45 mm, and La=Lb are satisfied.

FIG. 11 is a diagram illustrating a relationship between Lb/Wb (Lb/Wb=La/Wa in the experiment) and a hysteresis of the crystal resonator 600. In this regards, as described above, the hysteresis is the maximum value of the absolute value of the difference between the resonance frequency when the temperature is decreased and the resonance frequency when the temperature is increased in each temperature, which is acquired by measuring the resonance frequency of the crystal resonator 600 in each temperature when the temperature is decreased and the resonance frequency of the crystal resonator 600 in each temperature when the temperature is increased.

In addition, in FIG. 11, the hysteresis of the crystal resonator 600 is measured and acquired through the same method in the first embodiment. In the experiment, the hysteresises of the crystal resonator 600 having five types of ratios of Lb/Wb which are 0.40, 0.56, 0.77, 0.89, and 1.00 is measured and acquired.

From FIG. 11, it is found that when Lb/Wb which is the ratio of the distance Lb between the second bonding center 42b and the second virtual line 52 to the distance Wb between the resonation area center 11d and the end portion 59 of the resonation area 11c is 0.89, the hysteresis of the crystal resonator 600 is 0.07 ppm. In addition, from FIG. 11, it is found that when a value smaller than 0.40 is input to the ratio of Lb/Wb, the hysteresis of the crystal resonator 600 becomes further smaller. Accordingly, in a range of $0 < \text{Lb}/\text{Wb} \leq 0.89$, the hysteresis of the crystal resonator 600 is 0.07 ppm or less.

In addition, when Lb/Wb=0.77 is satisfied, the hysteresis of the crystal resonator 600 becomes 0.05 ppm. Accordingly, in a range of $0 < \text{Lb}/\text{Wb} \leq 0.77$, the hysteresis of the crystal resonator 600 is 0.05 ppm or less.

As described in the first embodiment, in the case where the hysteresis of the crystal resonator 600 is used for, for example, a reference frequency source of a femtocell base station device of a mobile phone and the like, the hysteresis is preferably 0.07 ppm or less, and in a case where the hysteresis of the crystal resonator 600 is used for, for example, a device which is synchronized with a GPS signal and a macrocell base station device of a mobile phone which require the high frequency accuracy, the hysteresis is preferably 0.05 ppm or less.

As described above, according to the crystal resonator 600 in the embodiment, it is possible to obtain the following effects in addition to the effect resulting from the crystal resonator 100 in the first embodiment. In the crystal resonator 600, for example, even in a case where the stress is generated due to a difference between the elongation amount or the shrinkage amount of the resonator element 610 and the elongation amount or the shrinkage amount of the bottom plate 21 in accordance with the change of the ambient temperature of the crystal resonator 600, Lb/Wb satisfies a relationship expressed by $0 < \text{Lb}/\text{Wb} \leq 0.89$, and thus it is possible to reduce the stress so as not to be transferred to the resonation area 11c of the resonator element 610. As a result, it is possible to reduce the variation in characteristics of the crystal resonator 600, for example, the value of hysteresis.

In addition, in the crystal resonator 600, for example, even in a case where the stress is generated due to a difference between the elongation amount or the shrinkage amount of the resonator element 610 and the elongation amount or the shrinkage amount of the bottom plate 21 in accordance with the change of the ambient temperature of the crystal resonator 600, Lb/Wb satisfies a relationship expressed by $0 < \text{Lb}/\text{Wb} \leq 0.77$ and thus it is possible to further reduce the stress so as not to be transferred to the resonation area 11c of the resonator element 610. As a result, it is possible to reduce the variation in characteristics of the crystal resonator 600, for example, the value of hysteresis by 28% or more than the case where Lb/Wb satisfies a relationship expressed by 0<Lb/Wb≤0.89.

Meanwhile, the experiment regarding Lb/Wb is performed when La=Lb and Wa=Wb are satisfied; however, La=Lb and Wa=Wb may not be necessarily satisfied. In this case, the experiment regarding Lb/Wb may be performed as long as the relationship expressed by 0<La/Wa≤0.89 or 0<La/Wa≤0.77 is satisfied in a case of La/Wb>Lb/Wb, and the relationship expressed by 0<Lb/Wb≤0.89 or 0<Lb/Wb≤0.77 is satisfied in a case of La/Wa≤Lb/Wb. The reason for this is that the larger one of La/Wa and Lb/Wb easily transfers the stress with respect to the resonation area 11c, that is, the larger one of La/Wa and Lb/Wb easily transfers the stress to the wider range of the resonation area 11c.

In addition, as in the first embodiment, even when the non-conductive member is used as at least one of the first bonding member 41 and the second bonding member 42, it is possible to obtain some effects of the first embodiment. That is, even when the non-conductive member is used as at least one of the first bonding member 41 and the second bonding member 42, the resonator element 610 is mechanically connected to the bottom plate 21 via the first bonding member 41 and the second bonding member 42. Accordingly, when the first bonding member 41 and the second bonding member 42 satisfy the relationships expressed by 0<La/Wa≤0.89 and 0<Lb/Wb≤0.89 in cases of La/Wa>Lb/Wb and La/Wa<Lb/Wb, it is possible to reduce the stress, which is generated due to the difference between the elongation amount or the shrinkage amount of the resonator element 610 and the elongation amount or the shrinkage amount of the bottom plate 21, so as not to be transferred to the resonation area 11c of the resonator element 610 in accordance with the change of the ambient temperature of the crystal resonator 600. As a result, it is possible to reduce the variation in characteristics of the crystal resonator 600, for example, the value of the hysteresis.

Meanwhile, in the embodiment, a configuration such that when the relationship expressed by 0<L1/L2≤0.97 is satisfied in the crystal resonator 100 of the first embodiment, relationships expressed by 0<La/Wa≤0.89 and 0<Lb/Wb≤0.89 are satisfied in cases of La/Wa>Lb/Wb and La/Wa<Lb/Wb is described; however, it is possible to obtain the same effect even with a configuration such that only the relationships expressed by 0<La/Wa≤0.89 and 0<Lb/Wb≤0.89 are satisfied in the cases of La/Wa>Lb/Wb and La/Wa<Lb/Wb is described.

Note that, the invention is not limited to the above-described embodiments, but can be performed by changing or modifying the above-described embodiments in various ways, or combining two or more of embodiments among the above-described embodiments.

Seventh Embodiment

Next, an oscillator of the seventh embodiment which includes any one of the crystal resonators 100, 200, 300, 400, 500, and 600 in the first embodiment to the sixth embodiment will be described with reference to FIGS. 12A and 12B. In addition, an example of using the crystal resonator 100 of the first embodiment as the resonation device is described in the present embodiment.

Figure 12A:
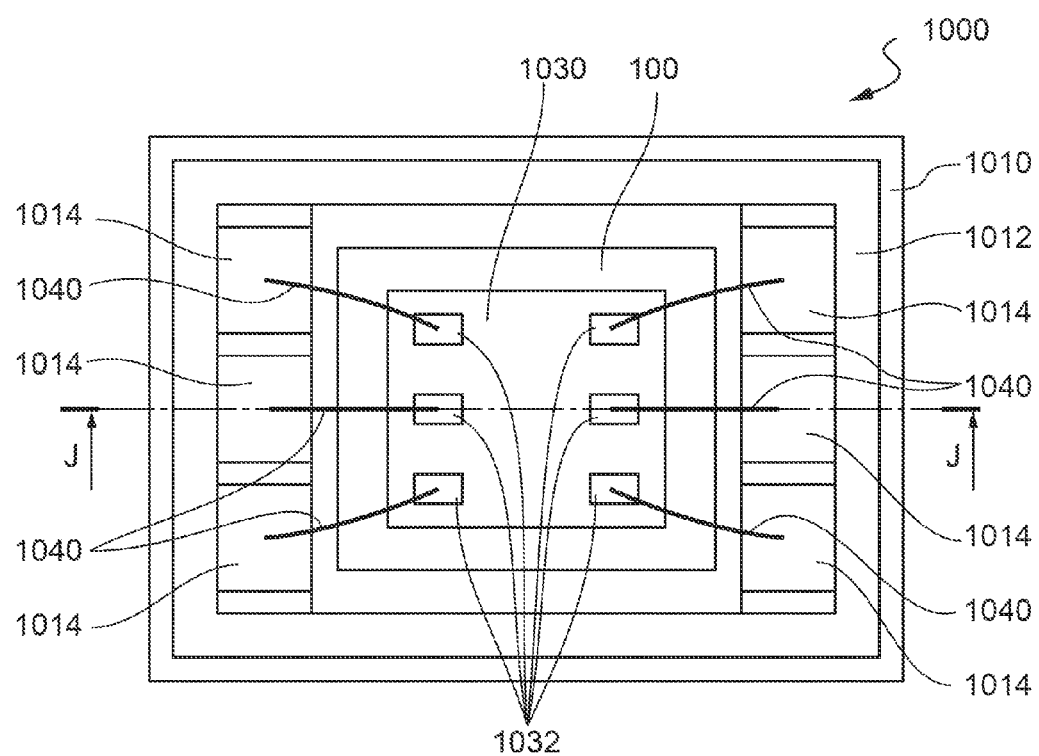
FIGS. 12A and 12B are schematic configuration diagrams of an oscillator resonator according to a seventh embodiment.
Figure 12B:
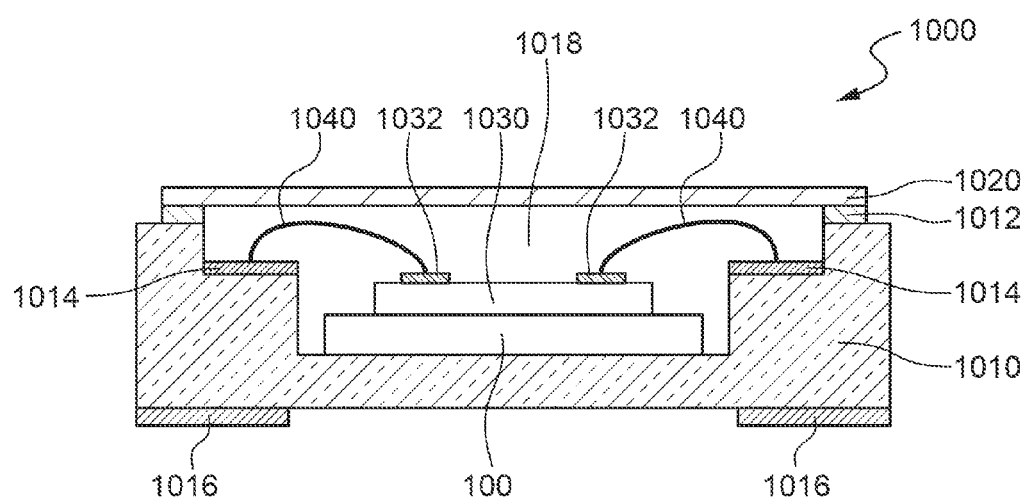

FIGS. 12A and 12B are schematic configuration diagrams of an oscillator 1000 as one example of the oscillator which includes the crystal resonator 100 according to the embodiment of the invention, and FIG. 12A is a plan view and FIG. 12B is a sectional view taken along line J-J of FIG. 12A.

Note that, for the sake of convenience of description, a lid 1020 is not shown in FIG. 12A. In addition, in the following description, an upper side in FIG. 12B is referred to as "up" and a lower side is referred to as "down", and a surface on the upper side of each member in FIG. 12B is referred to as an upper surface, and a surface on the lower side is referred to as a lower surface.

As illustrated in FIGS. 12A and 12B, the oscillator 1000 is formed of the crystal resonator 100, a container 1010, the lid 1020, an oscillation circuit 1030, a bonding wire 1040, and the like.

The container 1010 includes an inner space 1018 of which the center portion is depressed, and is provided with a seal ring 1012 which is formed into a frame shape along the upper surface of the container 1010, a plurality of internal connection terminals 1014 on a surface on the inner space 1018 side, and a plurality of external connection terminals 1016 on the lower surface. The internal connection terminal 1014 and the external connection terminal 1016 are electrically connected to each other via an internal wire (not shown).

The crystal resonator 100 is mounted on the inner space 1018 side of the container 1010, and is electrically connected to the internal connection terminal 1014 via the internal wire (not shown).

The oscillation circuit 1030 is a circuit for oscillating the crystal resonator 100, includes a plurality of pads 1032 on the upper surface thereof, and is on the upper surface (one surface) of the crystal resonator 100 via a bonding member (not shown), for example, an adhesive and a solder.

The bonding wire 1040 is a metallic wire (thin wire) such as gold (Au), and is electrically connected to the pad 1032 and the internal connection terminal 1014.

The lid 1020 is formed into a flat plate-like shape which covers an opening of the container 1010, and is bonded to the seal ring 1012 such that the inner space 1018 of the container 1010 is in an air-tight state.

A voltage for causing at least one terminal in the plurality of external connection terminals 1016 to operate the oscillation circuit 1030 is applied to the above-described oscillator 1000, an oscillating signal which is output from the oscillation circuit 1030 is output from the at least one terminal in the plurality of external connection terminals 1016, that is, the other terminal of the external connection terminals 1016.

As described above, when the oscillator 1000 as an example of the oscillator is provided with the crystal resonator 100 according to the embodiment of the invention, a stable frequency signal is output from the crystal resonator 100 as a reference frequency source of the oscillator, and thus it is possible to improve reliability of the operation of the oscillator 1000.

Eighth Embodiment

Next, an electronic apparatus of the eighth embodiment which includes any one of the crystal resonators 100, 200, 300, 400, 500, and 600 in the first embodiment to the sixth embodiment will be described with reference to FIG. 13 to FIG. 15. In addition, in the description of the embodiment, an example is described with reference the crystal resonator 100 in the first embodiment as the resonation device.

Figure 13:
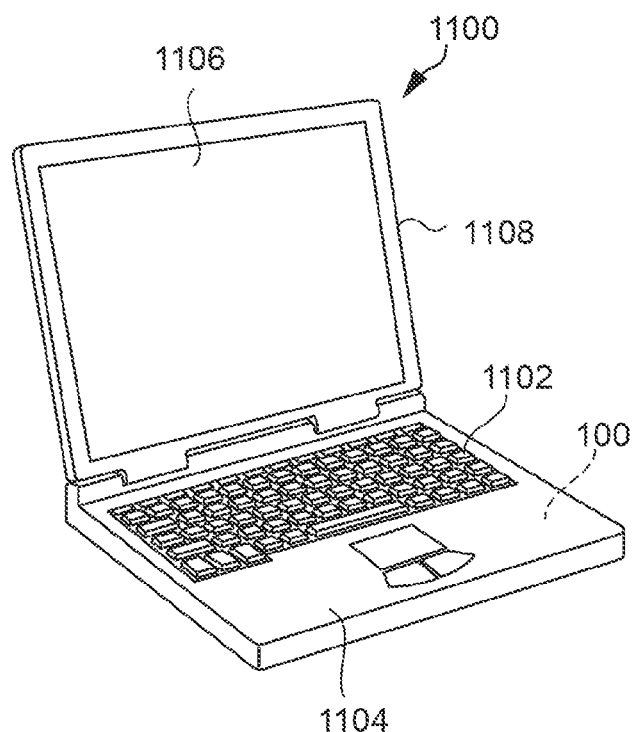
FIG. 13 is a perspective view illustrating a configuration of a mobile-type (or a note book-type) personal computer as an electronic apparatus according to an eighth embodiment.

FIG. 13 is a perspective view illustrating a configuration of a mobile-type (or a Note book-type) personal computer 1100 as an example of an electronic apparatus which includes the crystal resonator 100 in the first embodiment. As illustrated in FIG. 13, the personal computer 1100 is formed of a main body portion 1104 which includes a keyboard 1102, and a display unit 1108 which includes a display 1106, and the display unit 1108 is rotatably supported with respect to main body portion 1104 via a hinge structure. The crystal resonator 100 is built in such a personal computer 1100.

As described above, when the mobile-type (or the note book-type) personal computer 1100 as an example of the electronic apparatus is provided with the crystal resonator 100 according to the embodiment of the invention, for example, as a clock source, a stable frequency signal is output from the crystal resonator 100 as a clock source which is supplied to the mobile-type personal computer 1100, and thus it is possible to improve reliability of the operation of the mobile-type personal computer 1100.

Figure 14:
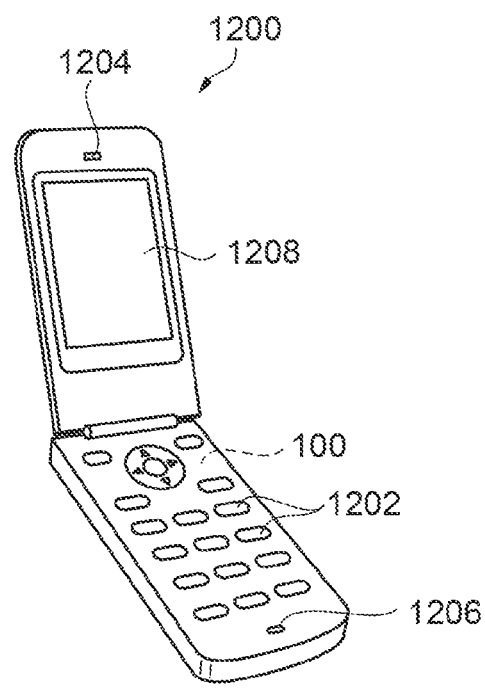
FIG. 14 is a perspective view illustrating a mobile phone as the electronic apparatus according to the eighth embodiment.

FIG. 14 is a perspective view schematically illustrating a configuration of a mobile phone 1200 (including PHS) as an example of the electronic apparatus which includes the crystal resonator 100 of the first embodiment. As illustrated in FIG. 14, the mobile phone 1200 is provided with a plurality of operation buttons 1202, an earpiece 1204, and a mouthpiece 1206, and a display 1208 is disposed between the operation buttons 1202 and the earpiece 1204. The crystal resonator 100 is built in such a mobile phone 1200.

As described above, when the mobile phone 1200 (including the PHS) as an example of the electronic apparatus is provided with the crystal resonator 100 according to the embodiment of the invention, for example, as a clock source, a stable frequency signal is output from the crystal resonator 100 as a clock source which is supplied to the mobile phone 1200, and thus it is possible to improve reliability of the operation of the mobile phone 1200.

Figure 15:
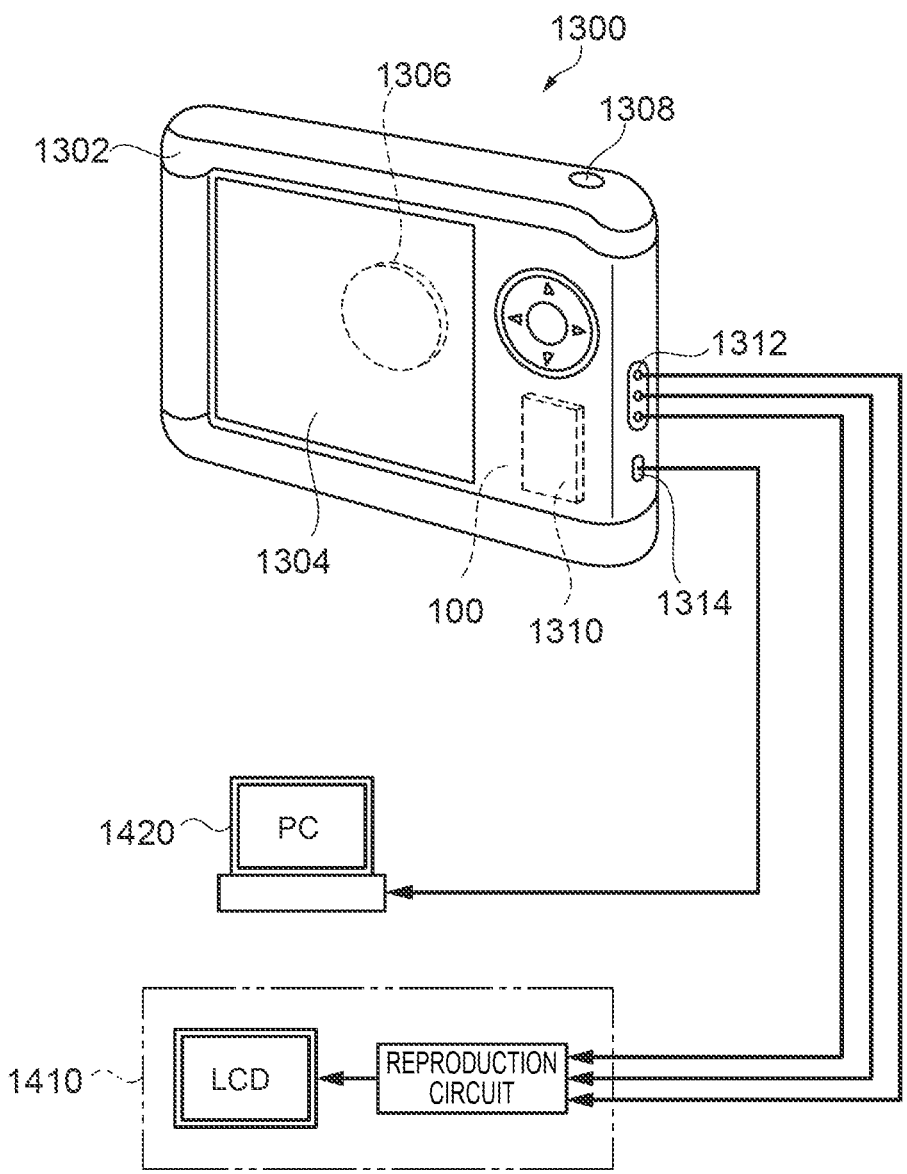
FIG. 15 is a perspective view illustrating a digital camera as the electronic apparatus according to the eighth embodiment.

FIG. 15 is a perspective view schematically illustrating a configuration of a digital camera 1300 as an example of the electronic apparatus which includes the crystal resonator 100 of the first embodiment. In addition, FIG. 15 briefly illustrates connection between the digital camera 1300 and external devices. Here, in a film camera of the related art, a silver-halide photo film is sensitized to light by an optical image of an object, whereas in the digital camera 1300, an imaging signal (an image signal) is generated by photo-converting an optical image of an object via an imaging element such as a charge coupled device (CCD).

A display 1304 is provided on a rear surface of a case 1302 (body) in the digital camera 1300, and performs a display based on the imaging signal by the CCD, and the display 1304 serves as a finder for displaying an object as an electronic image. In addition, a light receiving unit 1306 which includes an optical lens (an imaging optical system), a CCD, and the like is provided on the front surface (on the rear surface in the drawing) of the case 1302.

When a photographer confirms an object displayed on the display 1304, and presses a shutter button 1308, an imaging signal of the CCD is transferred to and stored in a memory 1310 at the same time. In addition, in the digital camera 1300, an output terminal 1312 of a video signal and an input and output terminal 1314 for data communication are provided on the side surface of the case 1302. As illustrated in FIG. 15, a TV monitor 1410 is connected to the output terminal 1312 of the video signal, and a personal computer 1420 is connected to the input and output terminal 1314 for data communication as necessary. Further, the imaging signal stored in the memory 1310 is output to the TV monitor 1410 or the personal computer 1420 by a predetermined control. The crystal resonator 100 is built in such a digital camera 1300.

As described above, when the digital camera 1300 as an example of the electronic apparatus is provided with the crystal resonator 100 according to the embodiment of the invention, for example, as a clock source, a stable frequency signal is output from the crystal resonator 100 as a clock source which is supplied to the digital camera 1300, and thus it is possible to improve reliability of an operation of the digital camera 1300.

Note that, the crystal resonator 100 of the first embodiment is applicable to other electronic apparatus in addition to the personal computer 1100 (a mobile-type personal computer) in FIG. 13, the mobile phone 1200 in FIG. 14, and the digital camera 1300 in FIG. 15.

Examples of other electronic apparatus include an ink jet discharge device (for example, an ink jet printer), a laptop personal computer, a tablet-type personal computer, a storage area network device such as a router and a switch, local area network equipment, mobile terminal base station equipment, a television, a video camera, a video recorder, a car navigation system, a real-time clock device, a pager, an electronic organizer (including an electronic organizer with a communication function), an electronic dictionary, a calculator, electronic game equipment, a word processor, a workstation, a videophone, a security television monitor, an electronic binocular, a POS terminal, medical equipment (for example, an electronic thermometer, a blood pressure monitor, a blood glucose meter, an electrocardiogram measuring device, an ultrasonic diagnostic device, and an electronic endoscope), a fish finder, various measurement equipment, an instrument (for example, instruments of a vehicle, an aircraft, and a ship), a flight simulator, a head-mounted display, a motion trace, a motion tracking, a motion controller, and a pedestrian position orientation (PDR).

Ninth Embodiment

Next, a moving object of the ninth embodiment which includes any one of the crystal resonators 100, 200, 300, 400, 500, and 600 in the first embodiment to the sixth embodiment will be described with reference to FIG. 16. In addition, an example of using the crystal resonator 100 of the first embodiment as the resonation device is described in the present embodiment.

Figure 16:
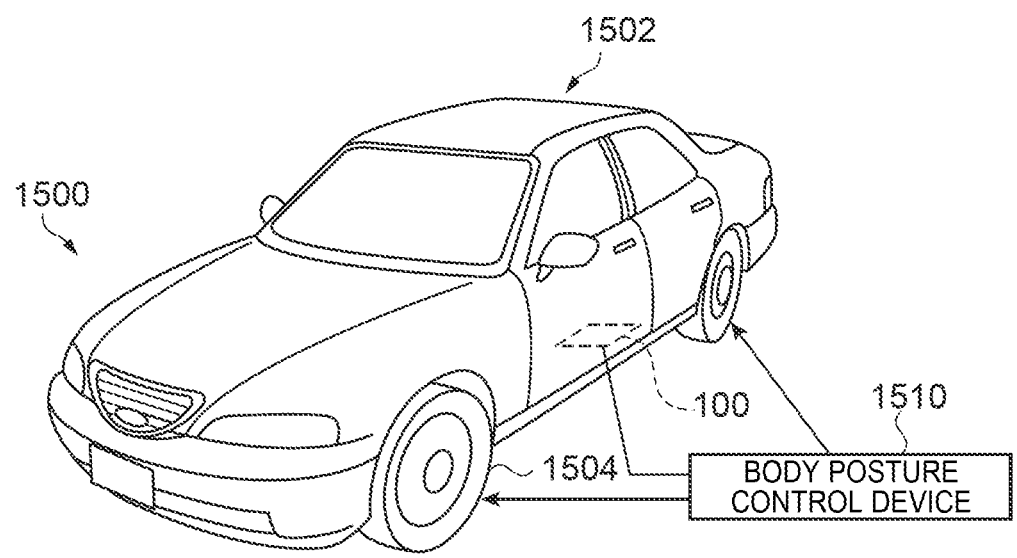
FIG. 16 is a perspective view illustrating an automobile as a moving object according to a ninth embodiment.

FIG. 16 is a perspective view schematically illustrating an automobile 1500 as an example of the moving object which includes the crystal resonator 100 of the first embodiment.

The crystal resonator 100 of the first embodiment is installed in the automobile 1500. As illustrated in FIG. 16, in the automobile 1500 as the moving object, the electronic control unit 1510 which includes the crystal resonator 100 built therein and controls a tire 1504 and the like is installed in a car body 1502. In addition, the crystal resonator 100 according to the embodiment of the invention is widely applicable to an electronic control unit (ECU) for a keyless entry system, an immobilizer, a car navigation system, a car air conditioning system, an anti-lock brake system (ABS), an airbag, a tire pressure monitoring system (TPMS), an engine control system, a braking system, a battery monitor for a hybrid vehicles and an electric vehicle, and a body posture control system.

As described above, when the automobile 1500 as an example of the moving object is provided with the crystal resonator 100 according to the embodiment of the invention, for example, as a clock, a stable frequency signal is output from the crystal resonator 100 as a clock source which is supplied to at least one of the automobile 1500 and the electronic control unit 1510, and thus it is possible to improve reliability of the operations of at least one of the automobile 1500 and the electronic control unit 1510.

The entire disclosure of Japanese Patent Application No. 2015-000676, filed Jan. 6, 2015 and 2015-000680, filed Jan. 6, 2015 are expressly incorporated by reference herein.

What is claimed is:

1. A resonation device comprising:
a substrate;
a resonator element that includes a resonator body and first and second excitation electrodes sandwiching the resonator body, the resonator body has:
  a thick area that is provided in the vicinity of a resonation center of the resonator body in a plan view,
    wherein a thickness of the thick area is larger than a thickness of another part of the resonator body, and
  the thick area has a thick area length in a first direction in the plan view; and
a first bonding member and a second bonding member that connect the resonator element to the substrate, a first bonding center of the first bonding member in the plan view and a second bonding center of the second bonding member in the plan view being disposed along the first direction,
wherein when viewed in a second direction perpendicular to the first direction, the first and second bonding members are entirely located within the thick area length so that a bonding edge length along the first direction between a first edge of the first bonding member located farthest from the second bonding member and a second edge of the second bonding member located farthest from the first bonding member is shorter than the thick area length, and
when a bonding center length between the first and second bonding centers is L1 and a perpendicular length of a perpendicular line drawn to a first virtual line which connects the first and second bonding centers from the resonation center of the resonator body is L2, a relationship expressed by 0<L1/L2≤0.97 is satisfied.

2. The resonation device according to claim 1, further comprising:
a first connection electrode that is electrically connected to the first excitation electrode, the first connection electrode having a first overlapped area overlapping with the first bonding member in the plan view; and
a second connection electrode that is electrically connected to the second excitation electrode, the second connection electrode having a second overlapped area overlapping with the second bonding member in the plan view,
wherein the first bonding center is a center of the first overlapped area in the plan view, and the second bonding center is a center of the second overlapped area in the plan view.

3. The resonation device according to claim 1, further comprising:
a first connection electrode that is electrically connected to the first excitation electrode, the first connection electrode overlapping with the first bonding member in the plan view;
a first extracting electrode that is physically electrically connected between the first excitation electrode and the first connection electrode;
a second connection electrode that is electrically connected to the second excitation electrode, the second connection electrode overlapping with the second bonding member in the plan view;
a second extracting electrode that is physically electrically connected between the second excitation electrode and the second connection electrode,
wherein a thickness of the resonator body where one of the first extracting electrode and the second extracting electrode is provided is larger than a thickness of the resonator body located between the first and second extracting electrodes in the plan view.

4. The resonation device according to claim 1,
wherein each of the first and second excitation electrodes includes a base layer including at least one type of metal of nickel and tungsten, and an upper layer including at least one type of metal among gold, platinum, silver, aluminum, and copper on the base layer.

5. The resonation device according to claim 1,
wherein a relationship of 0<L1/L2≤0.85 is satisfied.

6. The resonation device according to claim 1,
wherein a relationship of 0.185<L1/L2≤0.97 is satisfied.

7. The resonation device according to claim 1,
wherein a relationship of 0.425<L1/L2≤0.97 is satisfied.

8. The resonation device according to claim 1,
wherein a second virtual line passes through the resonation center and is parallel to the first direction, a distance between the first bonding center and the perpendicular line is La, a distance between the second bonding center and the perpendicular line is Lb, a distance between the resonation center and a first end of the first excitation electrode, which is positioned on a side of the first bonding member with respect to the perpendicular line and intersects with the second virtual line, is Wa, and a distance between the resonation center and a second end of the first excitation electrode, which is positioned on a side of the second bonding member with respect to the perpendicular line and intersects with the second virtual line, is Wb, and
wherein in case of La/Wa>Lb/Wb, a relationship of 0<La/Wa≤0.89 is satisfied, and
in case of La/Wa<Lb/Wb, a relationship of 0<Lb/Wb≤0.89 is satisfied.

9. The resonation device according to claim 8,
wherein in case of La/Wa>Lb/Wb, a relationship of 0<La/Wa≤0.77 is satisfied, and
in case of La/Wa<Lb/Wb, a relationship of 0<Lb/Wb≤0.77 is satisfied.

10. The resonation device according to claim 1,
wherein the first bonding member and the second bonding member have conductivity.

11. The resonation device according to claim 1,
wherein at least one of the first bonding member and the second bonding member is a metallic bump.

12. An oscillator comprising:
the resonation device according to claim 1, the resonation device having a lid, the resonator element is enclosed by the lid and the substrate;
an oscillation circuit that is connected to the resonation device via a first conductor; and
a container that accommodates the resonation device and the oscillation circuit.

13. An oscillator comprising:
the resonation device according to claim 2, the resonation device having a lid, the resonator element is enclosed by the lid and the substrate;
an oscillation circuit that is connected to the resonation device via a first conductor; and
a container that accommodates the resonation device and the oscillation circuit.

14. An oscillator comprising:
the resonation device according to claim 3, the resonation device having a lid, the resonator element is enclosed by the lid and the substrate;
an oscillation circuit that is connected to the resonation device via a first conductor; and
a container that accommodates the resonation device and the oscillation circuit.

15. An oscillator comprising:
the resonation device according to claim 4, the resonation device having a lid, the resonator element is enclosed by the lid and the substrate;
an oscillation circuit that is connected to the resonation device via a first conductor; and
a container that accommodates the resonation device and the oscillation circuit.

16. The oscillator according to claim 12,
wherein the lid and the oscillation circuit are connected to each other via a second conductor.

17. The oscillator according to claim 13,
wherein the lid and the oscillation circuit are connected to each other via a second conductor.

18. The oscillator according to claim 4,
wherein the lid and the oscillation circuit are connected to each other via a second conductor.

19. An electronic apparatus comprising the resonation device according to claim 1.

20. A moving object comprising the resonation device according to claim 1.

21. A resonation device comprising:
a substrate;
a resonator element that includes a resonator body and first and second excitation electrodes sandwiching the resonator body, the resonator body has:
a thick area that is provided in the vicinity of a resonation center of the resonator body in a plan view,
wherein a thickness of the thick area is larger than a thickness of another part of the resonator body, and
the thick area has a thick area length in a first direction in the plan view;
a first bonding member and a second bonding member that connect the resonator element to the substrate, a first bonding center of the first bonding member in the plan view and a second bonding center of the second bonding member in the plan view being disposed along the first direction
a first connection electrode that is electrically connected to the first excitation electrode, the first connection electrode overlapping with the first bonding member in the plan view;
a first extracting electrode that is physically electrically connected between the first excitation electrode and the first connection electrode;
a second connection electrode that is electrically connected to the second excitation electrode, the second connection electrode overlapping with the second bonding member in the plan view; and
a second extracting electrode that is physically electrically connected between the second excitation electrode and the second connection electrode,
wherein when viewed in a second direction perpendicular to the first direction, the first and second bonding members are located within the thick area length so that a bonding center length along the first direction between the first and second bonding centers is shorter than the thick area length, and
when the bonding center length between the first and second bonding centers is L1 and a perpendicular length of a perpendicular line drawn to a first virtual line which connects the first and second bonding centers from the resonation center of the resonator body is L2, a relationship expressed by $0<L1/L2\leq 0.97$ is satisfied, and
wherein a thickness of the resonator body where one of the first extracting electrode and the second extracting electrode is provided is larger than a thickness of the resonator body located between the first and second extracting electrodes in the plan view.

22. A resonation device comprising:
a substrate;
a resonator element that includes a resonator body and first and second excitation electrodes sandwiching the resonator body, the resonator body has:
a thick area that is provided in the vicinity of a resonation center of the resonator body in a plan view,
wherein a thickness of the thick area is larger than a thickness of another part of the resonator body, and
the thick area has a thick area length in a first direction in the plan view; and
a first bonding member and a second bonding member that connect the resonator element to the substrate, a first bonding center of the first bonding member in the plan view and a second bonding center of the second bonding member in the plan view being disposed along the first direction,
wherein when viewed in a second direction perpendicular to the first direction, the first and second bonding members are located within the thick area length so that a bonding center length along the first direction between the first and second bonding centers is shorter than the thick area length, and
when the bonding center length between the first and second bonding centers is L1 and a perpendicular length of a perpendicular line drawn to a first virtual line which connects the first and second bonding centers from the resonation center of the resonator body is L2, a relationship expressed by $0<L1/L2\leq 0.97$ is satisfied,
wherein a second virtual line passes through the resonation center and is parallel to the first direction, a distance between the first bonding center and the perpendicular line is La, a distance between the second bonding center and the perpendicular line is Lb, a distance between the resonation center and a first end of the first excitation electrode, which is positioned on a side of the first bonding member with respect to the perpendicular line and intersects with the second virtual line, is Wa, and a distance between the resonation center and a second end of the first excitation electrode, which is positioned on a side of the second bonding member with respect to the perpendicular line and intersects with the second virtual line, is Wb, and
wherein in case of La/Wa>Lb/Wb, a relationship of $0<La/Wa\leq 0.89$ is satisfied, and
in case of La/Wa<Lb/Wb, a relationship of $0<Lb/Wb\leq 0.89$ is satisfied.

* * * * *